United States Patent [19]

Ward et al.

[11] Patent Number: 4,864,543

[45] Date of Patent: Sep. 5, 1989

[54] FIRST-IN, FIRST-OUT MEMORY WITH COUNTER ADDRESS POINTERS FOR GENERATING MULTIPLE MEMORY STATUS FLAGS

[75] Inventors: Morris D. Ward, Garland; Kenneth L. Williams, Dallas, both of Tex.

[73] Assignee: Texas Instruments Incorporated, Dallas, Tex.

[21] Appl. No.: 45,010

[22] Filed: Apr. 30, 1987

[51] Int. Cl.[4] ......................... G11C 7/00; G11C 19/00
[52] U.S. Cl. ..................................... 365/221; 365/78; 365/230.01
[58] Field of Search .................. 365/78, 221, 220, 239, 365/240, 233, 189, 230; 377/28, 66

[56] References Cited

U.S. PATENT DOCUMENTS

| | | | |
|---|---|---|---|
| 4,314,361 | 2/1982 | Jansen et al. | 365/221 X |
| 4,592,019 | 5/1986 | Huang et al. | 365/78 X |
| 4,667,313 | 5/1987 | Pinkham et al. | 365/221 |
| 4,694,426 | 9/1987 | Mason | 365/78 X |

OTHER PUBLICATIONS

Computer Design, Aug. 1, 1986, pp. 109–112, "System Design/Memory Systems-FIFO RAM Controller" by Tom Pai.
Computer Design, Sep. 1, 1985, pp. 83–86, "High-Speed FIFO's Contend with Widely Differing Data Rates" by M. S. Miller et al.
Electronic Design Report, Jun. 11, 1987, pp. 77–86, "Rich with Logic, Memory ICs Hone Their Specialties".

Primary Examiner—Stuart N. Hecker
Assistant Examiner—Alfonso Garcia
Attorney, Agent, or Firm—George L. Craig; Thomas R. Fitzgerald; Melvin Sharp

[57] ABSTRACT

A first-in, first-out memory has a write pointer (34) that includes a higher-order ring counter (192) and a lower-order ring counter (190). Ring counters (190, 192) store respective higher-order and lower-order address digits that are together used to select one of a plurality of write select gates (202). Each gate (202) is operable to both power up and address is coupled to a respective memory word location. A read pointer (28) of the FIFO has an analogous architecture. The lower-order and higher-order address digits generated by the write and read pointers (34 and 28) are used by a pointer comparator (44) to generate a plurality of intermediate signals. The intermediate signals are in turn received by a flag decoder (52) that generates EMPTY, FULL, ALMOST-FULL/EMPTY, and HALF-FULL status flags. A write-read control section (48) of the FIFO has a pair of monostable multivibrators (68, 82) that generate write and read clock pulses of a uniform pulse width. The write/read control (48) further has a disabling circuit that disables either the read clock monostable multivibrator (82) or the write clock monostable multivibrator (68) responsive to an equality signal (50) from the flag decoder (52) and responsive whether the last pulse was a write clock or a read clock.

24 Claims, 9 Drawing Sheets

FIRST-IN, FIRST-OUT MEMORY WITH COUNTER ADDRESS POINTERS FOR GENERATING MULTIPLE MEMORY STATUS FLAGS

TECHNICAL FIELD OF THE INVENTION

The present invention relates in general to first-in, first-out (FIFO) memories, and more particularly relates to FIFO memories capable of storing a large number of words and generating ALMOST-FULL/ALMOST-EMPTY and HALF-FULL status flags.

BACKGROUND OF THE INVENTION

In digital systems, it is frequently necessary to interface different parts of the system which handle data at different rates. For example, it is often desirable to interface a disk drive to a central processing unit (CPU). Commonly, a first-in, first-out (FIFO) memory is used to perform this interface. A FIFO memory is a storage device that allows data to be written into it and read from it at different data rates.

Certain recent FIFO memories have the capability to store sixteen words, and use a write pointer to latch a current write address. While the write occurs to a memory location in the memory, the write pointer increments to the next location. This architecture, called a simultaneous memory write architecture, allows for a shorter write cycle time. An example of such a FIFO memory is described in our co-pending application Ser. No. 892,228, filed Aug. 1, 1986. Now U.S. Pat. No. 4,829,475. This memory employs a write address ring counter and a read address ring counter. The write address ring counter sequentially addresses each memory word location in response to input write commands. The read address ring counter operates similarly to sequentially read memory word locations responsive to input read commands. A comparator is provided for this device for comparing the current address of the write address ring counter with that of the read address ring counter. When equality exists between the counters, and if the last memory operation was a read operation, the next read operation will be inhibited by an EMPTY flag. On the other hand, if the write and read address ring counters point to the same memory location, and the last operation was a write operation, a further write operation without an intervening read will be inhibited by a FULL flag.

More recently, there has been a demand in the industry for one-chip FIFO memories with more capacity, such as a 64-word size. In addition, the industry has begun to specify that the FIFO memory outputs include, in addition to the EMPTY and FULL flags already mentioned, an ALMOST-FULL/ALMOST-EMPTY flag and a HALF-FULL flag.

Several schemes have been developed in order to select which of the words in a 64-word FIFO will be written into or read out of. One such scheme is to employ an n stage ring counter, where n is the number of memory words. The n ring counter method requires 64 flip-flops but no decoding circuitry. Another scheme is the $\log_2 n$ stage binary counter. This scheme requires six flip-flops, but also requires 64 6-input AND gates for decoding purposes.

Certain recent FIFO memories use a monostable multivibrator or one-shot generator in order to originate a WRITE CLOCK pulse for actuating the write address ring counter. As will be described in more detail below, one conventional approach is to input a nondelayed input signal into a NAND gate, and to also input the signal into a delay path including an RC circuit. The delay path inverts the delayed signal at its output, which is connected as an input to the NAND gate. Therefore, this one-shot generator will produce a signal as long as the inverted, delayed input has yet to be received by the NAND gate.

The dependence of this one-shot generator on an RC time constant causes problems in regulating the width of the one-shot output pulse. This output pulse must be wide enough for the pointers to successfully increment to a new location and to complete a memory write, but not so wide that the maximum clocking rate suffers. This one-shot circuit also produces a pulse width that is variable with the voltage swing of the signal. Both the RC delay and the voltage swing can substantially vary due to processing variations.

Conventional FIFO memories have a plurality of cell locations that are continuously powered up and enabled for either a memory write operation or a memory read operation. Where TTL logic is used, this requires a large amount of power consumption.

From the above, it can be seen that a need has arisen in the industry for a FIFO memory that: (a) has a larger-than-sixteen-word capacity, but is not unduly complex in its pointer and decoder circuitry; (b) is capable of generating FULL, EMPTY, ALMOST-FULL/ALMOST-EMPTY, and HALF-FULL flags with a minimum of extra circuitry; (c) incorporates a monostable multivibrator or one-shot generator with a more precisely controlled pulse width; and (d) has a memory cell design with decreased power consumption.

SUMMARY OF THE INVENTION

One aspect of the present invention comprises a first-in, first-out (FIFO) memory. The memory has a plurality of write- and read-addressable memory locations for storing data. A data input of the FIFO is coupled to a first connected device for writing data into at least one write-addressed memory location. A data output of the FIFO is coupled to a second connected device for reading data from at least one read-addressed memory location.

Circuitry is provided for determining how many of the memory locations are presently storing data. One technical advantage of the invention results in the inclusion in this circuitry of a first circuit for generating an ALMOST-EMPTY/ALMOST-FULL status flag when either most of the memory locations have no data stored therein, or when most of the memory locations do have data stored therein. Another advantage results from the provision of a second circuit of this circuitry for generating a HALF-FULL flag responsive to at least half of the memory locations having data stored therein. Outputs are provided for transmitting the ALMOST-EMPTY/ALMOST-FULL and the HALF-FULL status flags to the first and second connected devices. The circuitry preferably also includes circuits for generating $\overline{\text{FULL}}$ and $\overline{\text{EMPTY}}$ status flags.

Another aspect of the invention comprises an address pointer for a FIFO memory. One technical advantage inheres in the address pointer comprising a lower-order counter for storing a lower-order address bit at one of a plurality of address locations therein, and a higher-order counter for storing a higher-order address bit at one of a plurality of higher-order address locations therein. The higher-order address bit is operable to be incremented from a current address location to a next address location responsive to a signal from the lower-order counter. The lower-order counter transmits the signal responsive to a lower-order address bit being incremented to a predetermined one of the lower-order address locations.

A plurality of addressers are provided, each for addressing a respective memory location in the memory. A first input of each addresser receives an output from a higher-order address location. A second input of each said addresser receives an output from a lower-order address location. Each of the addressers operates to address a respective memory location responsive to sensing lower-order and higher-order address bits at its inputs.

The dual-tier or higher-order and lower-order architecture of the address pointer of the invention provides an advantage in that it reduces the number of gates, flip-flops and gate inputs required for decoding a selected one of the memory locations.

The two-tier ring counter structure minimizes the number of flip-flops and the number of the decoding gates. Flip-flops are required to obtain the simultaneous memory write technical advantage, as will be described in greater detail below. Only 16 flip-flops and 128 two-input AND gates are required in the illustrated embodiment.

The dual-tier approach also has advantages in generating the above-described memory status flags, as will be described below.

Yet another aspect of the invention comprises a FIFO memory register that comprises a plurality of read-addressable memory locations. A data output is provided for coupling at least one read-addressed memory location to a connected device. A read pointer of the FIFO comprises a plurality of read-addressers that are each operable to address at least one selected location of the memory. A technical advantage of the invention is provided by a read power-up output of each addresser that is operable to supply sufficient power to the addressed location to enable data at the location to be read. A read addressing output of each addresser is operable to cause the selected location to be read out to the data output. The addressable read power-up feature of the invention presents a technical advantage in that a first, low power consumption of each memory cell is all that is required to keep data stored therein. A second, higher power necessary to read out the cells in an addressed word can be selectively applied to the addressed word only, without powering up the remainder of the memory.

A further aspect of the invention comprises a FIFO memory register that has a plurality of write-addressable memory locations. A data input is provided for coupling at least one write-addressed memory location to a connected device. A write pointer of the FIFO comprises a plurality of write-addressers that are each operable to address at least one selected memory location. A write power-up output of each addresser is operable to supply sufficient power to the addressed memory location to enable data to be written into that location. A write addressing output of each addresser is operable to cause data to be written into the selected location from the data input. Preferably, a write power-up pulse begins to be delivered from the selected write-addresser at a time previous to delivering a pulse on the write addressing output. This insures that each memory cell so addressed will be completely powered up before the write addressing operation begins.

The addressable write power-up feature of the invention presents a technical advantage in that a low-power consumption of each non-addressed memory cell can be maintained, while spending a larger amount of power only on those cells selected for a write (or read) operation. The addressable read power-up and write power-up features of the invention together substantially reduce the power consumption of the FIFO memory.

In another aspect of the invention, outputs from a read pointer and a write pointer are advantageously used to generate memory status flags for output to connected devices. The read pointer comprises a register for storing a higher-order read address digit and a register for storing a lower-order read address digit. The write pointer similarly has a register for storing a higher-order write address digit and a register for storing a lower-order write address-digit.

The write pointer is operable to address a selected write-addressed location in the FIFO memory responsive to the value of the stored write address digit, and the read pointer is operable to address a selected read-addressed location responsive to the value of the stored read address digit. A status flag generator compares the write address digits to the read address digits and is operable to generate selected ones of a plurality of status flags responsive thereto. Each status flag is generated responsive to a selected numerical difference between the write address digits and the read address digits.

Preferably, the status flag generator is comprised of a pointer comparator that compares the higher-order write address digit to the higher-order read address digit, and the lower-order write address digit to the lower-order read address digit. These comparisons are used to generate a plurality of intermediate signals.

The status flag generator is further preferably comprised of a flag decoder that receives the intermediate signals and is operable to generate the memory status flags. The intermediate signals preferably comprise a plurality of higher-order intermediate signals that include: an $\overline{HE}$ signal that is in an active state responsive to the higher-order read address digit equalling the higher-order write address digit; an $\overline{HM1}$ signal generated responsive to the higher-order read address digit exceeding the higher-order write address digit by one; an $\overline{HP1}$ intermediate signal that is generated when the higher-order read address digit is less than the higher-order write address digit by one; and a further higher-order intermediate signal that is generated when the higher-order read address digit is displaced from the higher-order write address digit by half of the possible range of the higher-order address digits. A plurality of lower-order intermediate signals are also generated, and these preferably include $\overline{LM1}$, $\overline{LE}$ and $\overline{LP1}$. These signals are generated in a manner analogous to the generation of their higher-order intermediate signal counterparts.

The generation of the intermediate signals confers the advantage of being able to in turn generate HALF-FULL, $\overline{FULL}$, ALMOST-FULL/EMPTY and $\overline{EMPTY}$ status flags with a very small number of logic gates. The $\overline{LP1}$, $\overline{LM1}$, $\overline{HP4}$ and $\overline{LE}$ intermediate signals are used as into a HALF-FULL status flag generator. $\overline{LP1}$, $\overline{LM1}$, $\overline{HM1}$ and $\overline{LE}$ are used as inputs to an ALMOST-FULL flag signal generator. $\overline{LP1}$, $\overline{LM1}$, $\overline{LE}$ and $\overline{HP1}$ are used as inputs to an ALMOST-EMPTY flag signal generator. The ALMOST-FULL and ALMOST-EMPTY flag signals are used to generate an ALMOST FULL/ALMOST EMPTY status flag, and are further in turn used together with the $\overline{HE}$ and $\overline{LE}$ signals to generate $\overline{FULL}$ and $\overline{EMPTY}$ status flags.

One technical advantage of the invention is conferred by the pointers being organized into higher-order and lower-order address digit registers or ring counters. This represents a significant savings in the number of logic gates necessary to generate the status flags. For example, given a FIFO of 64 words controlled by a 64-stage, single-tier write pointer and a 64-stage, single-tier read pointer, a total of 320 gates would have to be included to generate HALF-FULL, $\overline{FULL}$, ALMOST-EMPTY, and $\overline{EMPTY}$ signal flags. These 320 gates would be apart from further gates that would be required to latch in conditions such that, for example, the HALF-FULL status flag would last longer than a single clock cycle, so that the HALF-FULL flag would continue to be in an active state when the write pointer was more than 50% of the memory ahead of the read pointer.

In contrast, the lower-order pointer comparator of the preferred embodiment uses 24 gates; the higher-order pointer comparator uses 32 gates; and the status flag decoder uses 21 further gates, for a total of 87 gates.

Another aspect of the invention comprises a novel one-shot generator or monostable multivibrator. The one-shot generator comprises a NAND gate, a latch and a delay path. The NAND gate is coupled to an input of the one-shot generator and its output is coupled to the output of the one-shot generator, and also to the input of the delay path. The latch has one input coupled to the input of the generator and an output coupled to an input of the NAND gate. A second input of the latch is coupled to the output of the delay path. The latch is initialized to store and transmit a first high signal, which in turn enables the NAND gate to output a low-going transition of a low pulse responsive to the multivibrator input going high. The low-going transition is output from the multivibrator and is further input into the delay path. The delay path in turn delivers the delayed low-going transition to the latch, which stores and transmits a low signal in response. The low signal causes the NAND gate to output a high-going transition, ending the output pulse. A succeeding low-going transition on the multivibrator input sets up the NAND gate and the latch to issue the next pulse responsive to the next high-going transition on the multivibrator input.

The one-shot generator of the invention provides a significant technical advantage in that the width of the pulses that it produces are not affected by RC time constant considerations or variations in load capacitance, both of which were problems with prior art one-shot circuits.

BRIEF DESCRIPTION OF THE DRAWINGS

These and other aspects of the invention and their advantages will be more fully understood by referring to the Detailed Description that follows in conjunction with the appended drawings in which.

DETAILED DESCRIPTION

Figure 1:
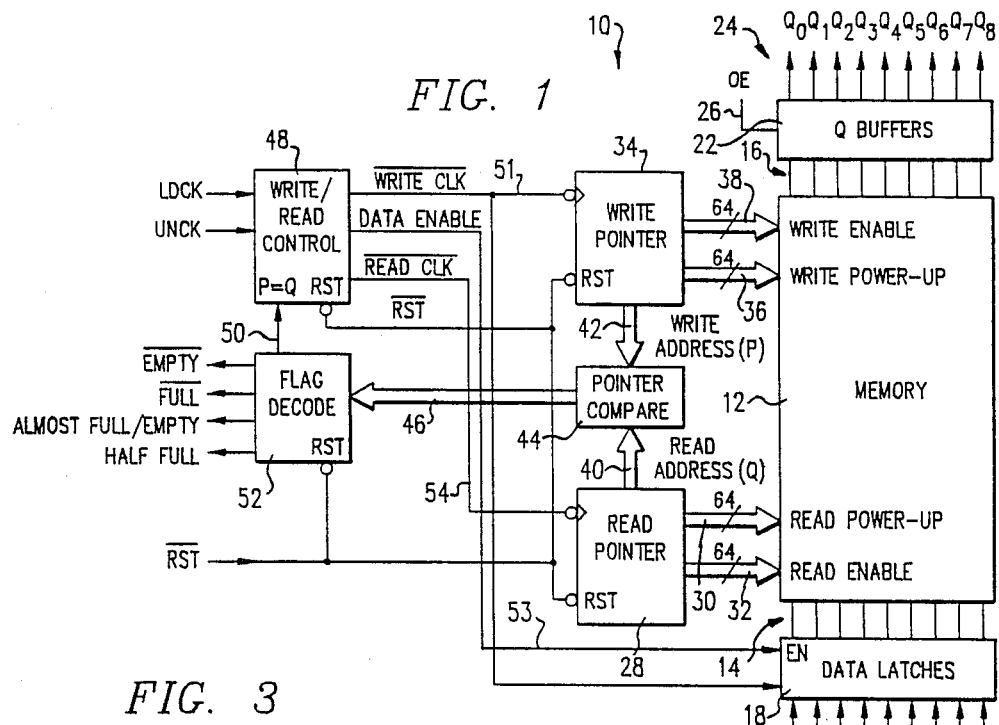
FIG. 1 is a schematic logic block diagram of a first-in, first-out (FIFO) memory according to the invention.

Referring first to FIG. 1, a logic block diagram of a preferred FIFO memory 10 according to the invention is shown. Memory 10 comprises a memory array 12 that in a preferred embodiment has 64 rows and nine columns. The illustrated memory array 12 is capable of storing 64 words, each word having nine bits. Array 12 has a plurality of data inputs indicated generally at 14 and a plurality of data outputs indicated generally at 16. Inputs 14 are output from a plurality of data latches 18, which are in turn connected to a plurality of external data inputs indicated generally at 20. External data or external write inputs 20 are in turn output from a first connected data-transmitting device (not shown).

Outputs 16 are coupled to a plurality of output or "Q" buffers 22. Buffers 22 are in turn coupled to a plurality of external data or external read outputs 24. Outputs 24 are in turn connected to a second, connected data-receiving device (not shown). Buffers 22 further receive an output enable (OE) line 26.

Each word location, or row of cells, in memory 12 is independently addressable for a read operation or a write operation. A read pointer 28 is provided for addressing a selected memory word location for a read operation to read buffers 22. Pointer 28 also acts to power up the selected word location or row of cells simultaneously with the read address operation by means of a read power-up bus 30. The read address operation is initiated by a signal on a read enable bus 32. Preferred read address and power-up operations will be more particularly described in conjunction with FIGS. 9, 11a, 11b and 14 below.

A write pointer 34 is analogously provided to select one of the 64 word locations in the array for a write operation from the data latches 18. Write pointer 34 is provided with a write power-up bus 36 that acts to power up a selected row or word of memory cells prior to the actual write operation. Then, a subsequent signal transmitted by a write enable bus 38 initiates the actual write address operation, in which data is transferred into the addressed memory cells. The structure and operation of a preferred embodiment of the memory cells will be more particularly described in conjunction with FIGS. 15 and 16. A preferred embodiment of write pointer 34 is more particularly described in conjunction with FIGS. 7 and 8.

Read pointer 28 further outputs a read address on a preferably 16-line read address bus 40. Similarly, write pointer 34 outputs a write address on a preferably 16-line write address bus 42. Address buses 40 and 42 are input into a pointer comparator 44. Pointer comparator 44 compares write pointer 34 with the read pointer 28 with respect to the memory locations to which they are pointing, and generates a plurality of intermediate signals on its output bus 46. The structure and operation of a preferred pointer comparator 44 will be more particularly described in conjunction with FIGS. 15a and 15b.

Memory 10 is further provided with a write/read control section 48. Write/read control section 48 has load clock (LDCK) signal and an unclock (UNCK) external clock signal inputs, a reset ($\overline{RST}$) signal input, and a P=Q signal input on line 50. Write/read control section 48 generates a $\overline{WRITE\ CLOCK}$ signal on line 51, a DATA ENABLE signal on line 53, and a $\overline{READ\ CLOCK}$ signal on line 54. A bar over a signal name as used herein indicates that the active state of the signal is its low or "0" state. The $\overline{WRITE\ CLOCK}$ signal is input into write pointer 34 and into data latch section 18. The $\overline{READ\ CLOCK}$ signal is input on line 54 into read pointer 28. The DATA ENABLE signal is input on line 53 into data latch section 18. The $\overline{RST}$ signal is further input into write pointer 34 and read pointer 28. A preferred embodiment of write/read control section 48 is described in more detail in conjunction with FIG. 2-6.

A flag decoder section 52 completes memory 10 and is provided for generating an $\overline{EMPTY}$ status flag, a $\overline{FULL}$ status flag, an ALMOST-FULL/EMPTY status flag, and a HALF-FULL status flag. The flags are output to the connected devices (not shown). Flag decoder section 52 receives as inputs the $\overline{RST}$ signal and the intermediate signals on bus 46. Decoder 52 further generates a P=Q signal on line 50 responsive to the address of the read pointer 28 being equal to the address of the write pointer 34. A preferred flag decoder section 52 is described in more detail in conjunction with FIGS. 16 and 17.

Figure 2:
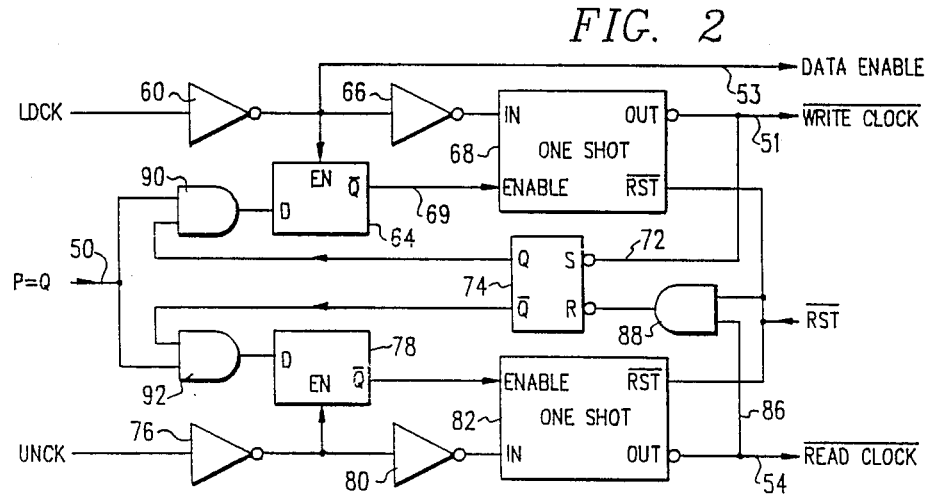
FIG. 2 is a detailed schematic logic diagram of a write/read control section of the FIFO memory shown in FIG. 1.

Referring now to FIG. 2, write/read control section 48 is shown detail by a logic diagram. The LDCK signal is input into an inverter 60. The output of inverter 60 becomes the DATA ENABLE signal, and is output on line 53. The DATA ENABLE signal is further input into a write-disabling latch 64, such as a transparent latch, and into a further inverter stage 66. The output of inverter stage 66 is input into a one-shot generator or monostable multivibrator 68. One-shot generator 68 receives a further input from the $\overline{Q}$ output of latch 64 on line 69 as an enabling input, and also the $\overline{RST}$ signal. One-shot generator 68 generates a $\overline{WRITE\ CLOCK}$ pulse, which is output on line 51 and is further fed back on a line 72 to a register 74, such as an S/R flip-flop.

The UNCK signal is input into an inverter 76. The output of inverter 76 is input into an enabling gate of a read-disabling latch 78, and is further received as an input of a second inverter stage 80. The output from inverter stage 80 is input into a one-shot generator 82. One-shot generator 82 receives an ENABLE input from the Q output of latch 78, and further a $\overline{RST}$ input. One-shot generator 82 is operable to produce a $\overline{READ\ LOCK}$ signal on output line 54 responsive to an UNCK pulse input from inverter 80. The $\overline{READ\ CLOCK}$ signal is further input on a line 86 to an AND gate 88. AND gate 88 receives the $\overline{RST}$ signal as its other input. The output of AND gate 88 is input into the reset terminal of S/R flip-flop 74.

A Q output of flip-flop 74 is connected to an input of an AND gate 90, and a "P=Q" signal is input on line 50 to the other input of AND gate 90. The output of AND gate 90 is coupled into an input of latch 64. The Q output of S/R flip-flop 74 is input into a first input of an AND gate 92. The P=Q signal is input on line 50 to the other input of AND gate 92. The output of AND gate 92 is connected to the input of, latch 78.

In operation, $\overline{WRITE\ CLOCK}$ pulse generator 68 produces a negative-going pulse responsive to a low-to-high transition from inverter 66, as long as the $\overline{Q}$ output of latch 64 is high. S/R flip-flop 74 is set by a $\overline{WRITE\ CLOCK}$ pulse as fed back from pulse generator 68, and is reset by the AND of $\overline{RST}$ and a $\overline{READ\text{-}CLOCK}$ pulse. Therefore, S-R flip-flop 74 keeps track of whether the last operational clocking pulse was a $\overline{READ\ CLOCK}$ or a $\overline{WRITE\ CLOCK}$, thus maintaining an account of whether the last operation was a read or a write.

The P=Q signal from flag decoder 52 (FIG. 1) is high only when the read and write pointers are addressing the same memory location. This occurs in turn only when the memory array 12 is completely full or completely empty. If the last operation was a write and P=Q goes high, indicating that the array 12 is full, a high will appear at the "D" input of write disabling latch 64. A low level will be passed to the $\overline{Q}$ output of latch 64 when the LDCK input goes low, as delayed and inverted by inverter 60. A low level on the $\overline{Q}$ output of latch 64 disables one-shot generator 68, and prevents any more $\overline{WRITE\ CLOCK}$ pulses from being generated until the read and write pointers separate.

Similarly, the P=Q signal going high immediately after a read indicates a completely empty condition of array 12. By a mechanism analogous to the $\overline{WRITE\ CLOCK}$ prevent sequence described above, this empty condition will prevent further $\overline{READ\ WRITE}$ pulses from being generated by one-shot generator 82. A low pulse from gate resets the S/R flip-flop 74. The reset signal sets both pointers 34 and 28 (FIG. 1) to the same address, resetting the FIFO to an empty condition. The $\overline{READ\ CLOCK}$ one-shot generator 82 will therefore be disabled from generating further $\overline{READ\ CLOCK}$ pulses until at least one write operation occurs.

Figure 3:
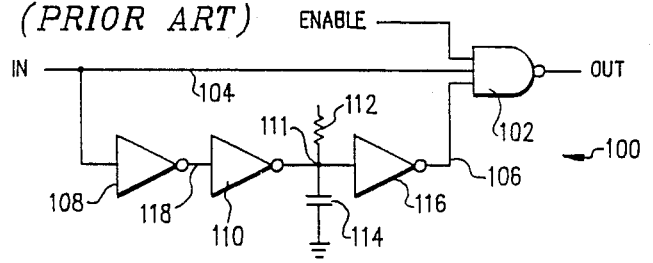
FIG. 3 is a schematic electrical diagram of a prior art one-shot generator.

Referring now to FIG. 3, a prior art one-shot generator is schematically shown at 100. The illustrated structure was used in certain recent FIFOs to generate $\overline{READ\ CLOCK}$ and $\overline{WRITE\ CLOCK}$ pulses. One-shot generator 100 comprises a NAND gate 102 that receives as its inputs an enabling signal, an undelayed input on line 104, and a delayed input on line 106. In the delay path, the input is first fed into a first inverter 108, which in turn inverts the signal and outputs it into a second inverter 110. The output of second inverter 110 is connected to a node 111, which in turn is connected to a resistor 112 and a capacitor 114. Node 111 is further connected to the input of a third inverter 116 whose output is in turn connected to line or node 106. Line 106 is connected as an input to NAND gate 102.

Figure 4:
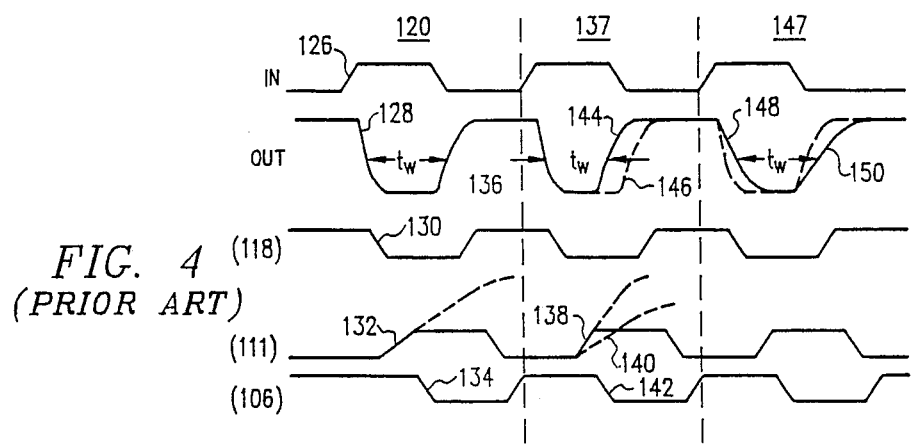
FIG. 4 is a timing diagram illustrating the operation of the prior art one-shot generator shown in FIG. 3.

The operation of the prior art one-shot circuit shown in FIG. 3 is described in conjunction with a corresponding timing diagram shown in FIG. 4. Referring jointly to FIGS. 3 and 4, the signals at a node 118 after first inverter 108, node 111 after second inverter 110, and node 106 after third inverter 116 are each shown by correspondingly labeled voltage plot lines in FIG. 4. The input and the output of one-shot generator 100 are also shown.

A first, leftmost region 120 of the timing diagram illustrates the. planned operation of one-shot circuit 100. Originally, the inputs into NAND gate 102 are initialized to have a high enabling input, a low undelayed input 104 and a high delayed input on line 106. To start the generation of a pulse, the input of one-shot generator 100 receives a high transition at 126. Since all three inputs are high at NAND gate 102, a negative transition will occur at time 128 at the output. Transition 126 is also inverted, causing node 118 to drop at time 130. This in turn is inverted once more, causing node 111 to begin to rise at 132. The slope of curve 132 is determined by the resistance and capacitance values of resistor 112 and capacitor 114. When curve 132 reaches the threshold of inverter 116, a low-going transition at its output 106 will occur at time 134. This in turn will cause the output of the generator to rise at time 136.

A middle section 137 of FIG. 4 illustrates the operation of prior art one-shot circuit 100 when the respective R and C values of resistor 112 and capacitor 114 produce a shorter-than-expected RC time constant. This time, the positive-going transition 138 occurs at node 111 faster than planned, the planned transition being shown as a dotted line at 140. The low-going transition at node 106 will therefore occur more quickly at time 142. This in turn will cause a premature ending of the one-shot output pulse at time 144. The planned pulse ending transition is shown by a dotted line at 146.

A third, rightmost section 147 in FIG. 4 illustrates the operation of the prior art one-shot circuit where a higher-than-expected load capacitance is encountered by the output of the one-shot. The various transitions on plots 118, 120 and 106 will be normal, but the rate of decrease on leading transition 148 and the rate of increase on trailing transition 150 will be changed according to the time required to discharge and then charge the output line.

The effects illustrated by sections 137 and 147 of FIG. 4 are undesirable because the width of the one-shot output pulse is critical for correct operation of the FIFO of the invention. The one-shot pulse produced on the output must be wide enough for pointers 28 and 34 (FIG. 1) to successfully increment and for pointer 34 to complete a memory write, but the pulse must not be so wide that the maximum clocking rate of the FIFO suffers.

Figure 5:
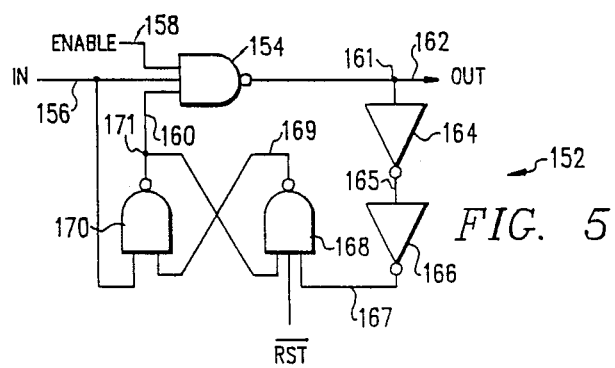
FIG. 5 is a schematic logic diagram of a one-shot generator according to the invention.
Figure 6:
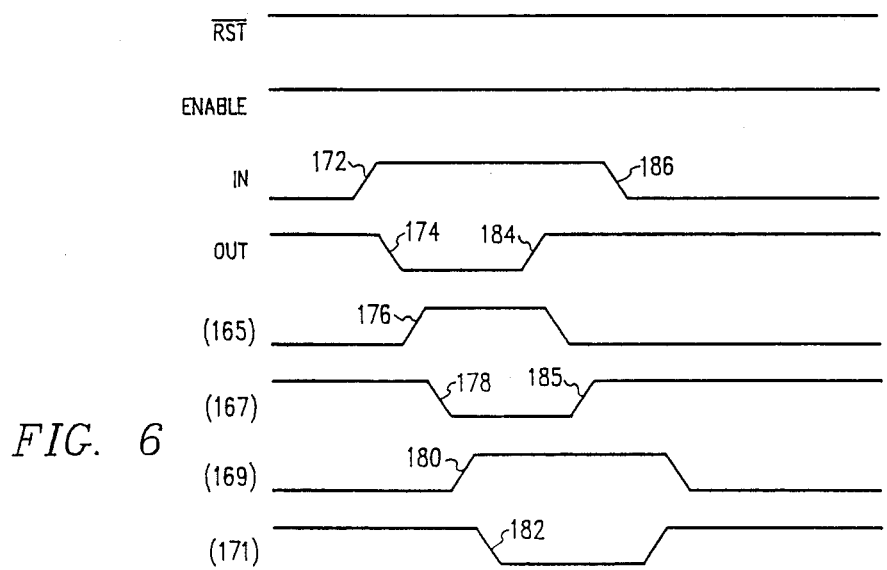
FIG. 6 is a timing diagram illustrating the operation of the one-shot generator shown in FIG. 5.

Referring now to FIG. 5, a logic diagram of a one-shot generator or monostable multivibrator 152 according to the invention is shown. One-shot generator 152 comprises a NAND gate 154 having inputs connected to a non-delayed one-shot input path 156, an enabling input 158, and a delayed input 160. The output of NAND gate 154 is connected to a node 161, which in turn is connected to a one-shot output 162 and to the input a first inverter stage 164. An output 165 of first inverter stage 164 is connected to the input of a second inverter stage 166. An output 167 of second inverter stage 166 is connected to one of the inputs of a NAND gate 168. A $\overline{\text{RST}}$ input is also input into NAND gate 168.

NAND gate 168 has an output 169 that is connected to an input of a NAND gate 170. A second input of NAND gate 170 is connected to one-shot input line 156. The output of NAND gate 170 is connected to a node 171, which in turn is connected to an input to NAND gate 168, thus cross coupling gates 168 and 170. Node 171 is further connected by line 160 to an input of NAND gate 154.

As will be described in detail below, NAND gates 168 and 170 act together as a latch for storing and outputting a state responsive to the states on lines 156 and 167. FIG. 5 is a timing diagram of the operation of the circuit shown in FIG. 5, and thus the operation of one-shot 152 will next be described with reference to both FIGS. 5 and 6.

Initially, the $\overline{\text{RST}}$, ENABLE and output plots are all high, while the input is low. A high-going transition of the one-shot input at time 172 will make all inputs of NAND gate 154 high, thus producing a low-going transition at time 174 on node 161 and output 162. Low-going transition 174 is inverted on line 165 at time 176, and is inverted again on line 167 at time 178. Since the remaining inputs of NAND gate 168 are at this point high, low-going transition 178 produces a high-going transition 180 at output 169. This in turn is fed back to an input of NAND gate 170, causing node 171 to go low at time 182. The low state of node 171 is transmitted via line 160 back to NAND gate 154, the output of which will go high at time 184. The return to a high output state is thereafter reflected by a high state on line 167 at time 185. When the one-shot input pulse goes low at time 186, node 171 will return to a high state and line 169 will return to a low state. Only then will generator 152 be able to output the next low-going pulse.

The novel one-shot generator illustrated in FIG. 5 presents an advantage in that the pulse width is determined only by the propagation delays of the gates in the circuit, which vary no more than the gates in the rest of the FIFO. Thus, any gate delay variations that are present will not have as much impact on performance as variations in the RC time constant affecting the performance of the prior art one-shot circuit 100 (FIG. 3). The new one-shot generator 152 shown in FIG. 5 provides a further technical advantage in that its output pulse has a width that is not dependent on the load capacitance of the circuit to which its output is connected. This is because the signal necessary to make the output go high again does not occur until several gate delays after the output reaches its low level. One-shot generator 152 is therefore preferably used for both the $\overline{\text{WRITE CLOCK}}$ one-shot generator 68 and the $\overline{\text{READ CLOCK}}$ one-shot generator 82 shown in FIG. 2.

Figure 7:
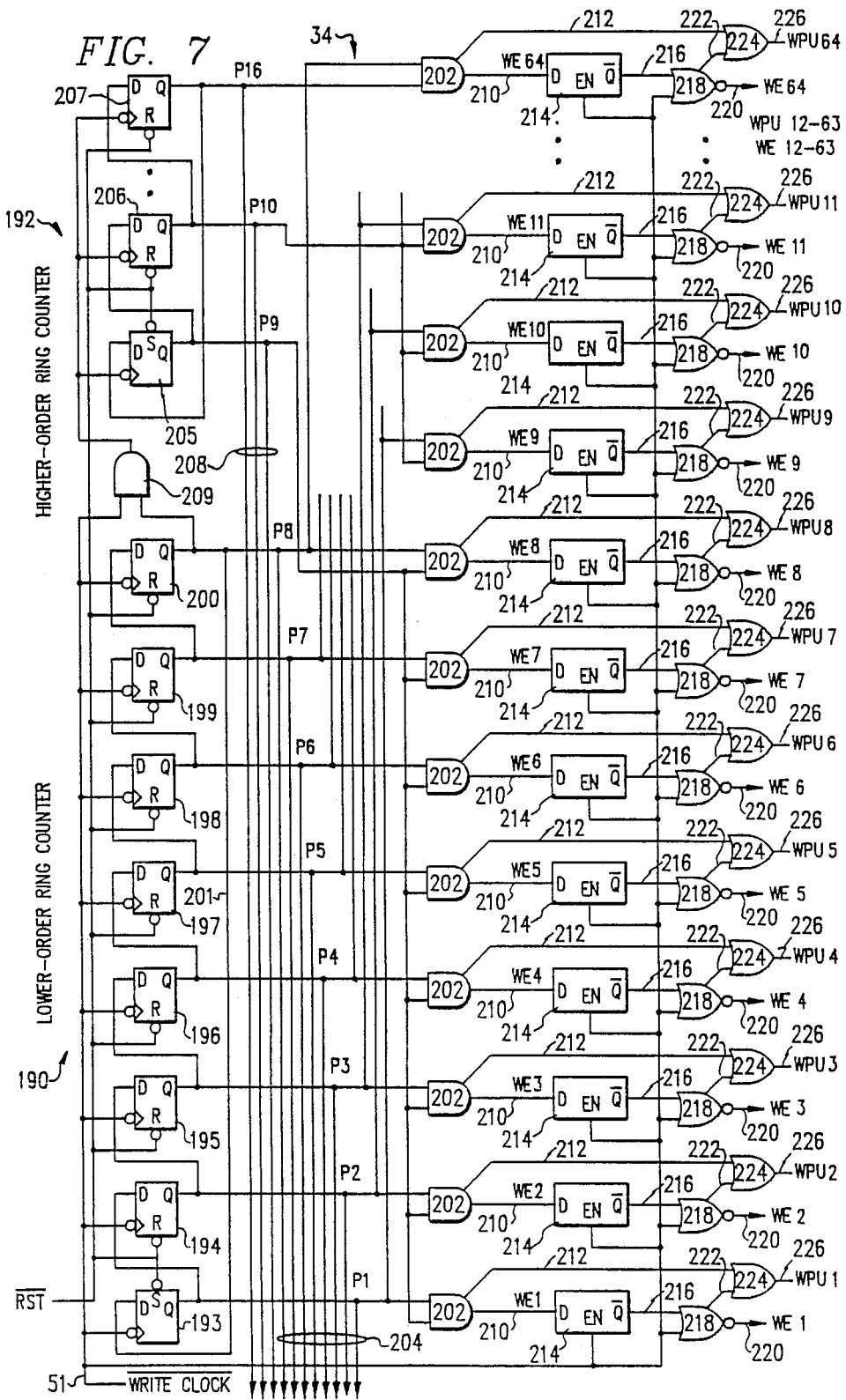
FIG. 7 is a detailed schematic electrical diagram of the write pointer shown in FIG. 1.

Referring now to FIG. 7, a schematic logic diagram of write pointer 34 is shown. Write pointer 34 is comprised of a lower-order ring counter or lower-order address digit register indicated generally at 190, and a higher-order ring counter or higher-order address digit indicated generally at 192. Lower-order ring counter 190 is comprised of a plurality of D/Q flip-flops or stages 93–200. Each flip-flop 193–200 is clocked by a WRITE CLOCK signal input on line 51. Flip-flops 194–200 each have a reset input connected to the $\overline{\text{RST}}$ signal source, a D input, and a Q output. $\overline{\text{RST}}$ is connected to a "set" input of flip-flop 193. The D input of any one stage 194–200 is connected to the Q output of the previous stage. A last stage 200 is connected via line 201 to the D input of a first stage 193, thus creating a ring of stages.

The output of each lower-order ring counter stage 193–200 is connected to a respective one of eight output lines P1–P8. Each output line P1–P8 is connected to the input of selected ones of a plurality of write select gates 202. The number of write select gates 202 will be an integral multiple of the number of flip-flops 193–200. Each flip-flop output signal P1–P8 is further output on a line 204 to pointer comparator 44 (FIG. 1), the lines 204 making up a portion of write address bus 42.

Higher-order ring counter 192 is comprised of a plurality of similar D-Q flip-flops 205, 206 . . . 207, which are connected sequentially in a ring in a manner similar to lower-order ring counter 190. The Q output of each stage or flip-flop 205–207 is connected to a respective output line P9–P16. The flip-flops and other circuitry related to lines P11–P15 have been omitted for brevity. $\overline{\text{RST}}$ is connected to a "reset" input of each of flip-flops 206–207, and is connected to a "set" input of flip-flop 205. Each flip-flop output P9–P16 is connected to selected ones of write select AND gates 202, such that each AND gate 202 receives one output from one of stages 205–207 of higher-order ring counter 192, and another output from one of stages 193–200 of lower-order ring counter 190. The number of write select gates 202 is equal to the number of stages 193–200 times the number of stages 205–207. In the illustrated embodiment, there are eight stages 193–200 and eight stages 205–207, and therefore there are 64 stages 202. The outputs from each of stages 205–207 are further output on respective address lines 208 to pointer comparator 44 as a portion of bus 42 (FIG. 1).

As will be described in more detail below, register or ring counter 190 operates to store a lower-order address digit having a value ranging from 1 to 8, depending on the flip-flop position of a nonzero address bit (described below) stored in one of flip-flops or stages 193–200. In a similar manner, higher-order register or ring counter 192 stores a higher-order address digit having a value in the range of 1 to 8. Registers 190 and 192 therefore operate to store a base eight address ranging from "11" to "88".

An AND gate 209 receives at its inputs the P8 signal line from lower-order stage 200 and the $\overline{\text{WRITE CLOCK}}$ signal on line 51. The output of AND gate 209 is input into the clock inputs of each of stages 205–207.

When a selected one of write select AND gates 202 receives a high state both on a connected higher order address input line P9–P16 and a connected lower-order address input line P1–P8, it will generate a WRITE SELECT signal on its write select output line 210, and a further write signal on an output line 212. Each write select output line 210 is input into the D input of a respective latch 214. Each latch 214 has an enabling input connected to the $\overline{\text{WRITE CLOCK}}$ signal line 51, and a $\overline{\text{Q}}$ output 216 connected to a respective write enable NOR gate 218. Each write enable NOR gate 218 has a second input connected to the $\overline{\text{WRITE CLOCK}}$ signal line, and produces two outputs. The first of these is a write enable (WE) line 220, while the second is a write signal line 222. Each pair of write signal lines 212 and 222 connect to the inputs of a respective write power-up OR gate 224. Each OR gate 224 is operable to produce a write power-up (WPU) signal on its output 226. Each set of gates 202, 218 and 224, latch 214 and lines 210, 216, 220, 222 and 226 functions as an addressing unit for powering up and addressing a single word location in memory array 12.

The operation of write pointer 34 will now be described with reference to both FIG. 7 and FIG. 8, the latter being a timing diagram showing write pointer 34's operation. One of the lower-order ring counter stages 193–200 will contain a "one" bit, as will one of the higher-order ring counter stages 205–207. Initially, a low $\overline{\text{RST}}$ pulse will set stages 193 (P1) and 205 (P9) to contain a "one" bit, while resetting the remaining stages 194–200, 206–207 to contain a "zero" bit. Responsive to each successive low-going transition of a $\overline{\text{WRITE CLOCK}}$ pulse on line 51, all of the lower-order stages 193–200 transfer the bit residing in them to the next succeeding stage. In this way, the lower-order "one" address bit will work upward from stage 193 (P1) to stage 200 (P8). When the "one" bit gets to stage 200, it and the next high transition of $\overline{\text{WRITE CLOCK}}$ will clock each upper-order stage 205–207. The first time this happens, the "one" bit initially stored in stage 205 (P9) will be advanced to the next succeeding stage 206 (P10). Thus, the described flip-flop connections produce a two-tier ring counter where the lower-order ring counter counts "ones" and the upper-order ring counter counts "eights". The two-tier ring counter concept may also be applied to a number system of another base, such as a hexadecimal or decimal system.

The location of the lower-order "one" bit in one of the stages 193–200 and the location of the higher-order "one" bit in one of the stages 205–207 together represent the address of a selected row of cells in memory 12 (FIG. 1), and will together act to select one of the sixty-four AND gates 202. Therefore, one of the signal lines 212 will go high, and a corresponding one of the write select (WS) lines 210 will go high.

Latches 214 are rendered transparent by a high transition of the $\overline{\text{WRITE CLOCK}}$ signal, and only then will a selected latch 214 store the high state that had appeared at its D input after the last $\overline{\text{WRITE CLOCK}}$ low-going transition. This high state will be inverted on a respective latch output line 216 and fed into a respective write enable NOR gate 218. A high write enable (WE) pulse will be produced on the respective write enable line 220 upon the receipt by the respective gate 218 of the next low going transition of $\overline{\text{WRITE CLOCK}}$. Gate 218 will also simultaneously output a high signal on line 222. Write power-up OR gate 224 will send out a high state on its output 226 (WPU) when either of its respective inputs 212 or 222 is high. Therefore, the write power-up (WPU) pulse produced by the selected OR gate 226 will be high during either the activation of the respective write select AND gate 202 or the write enable NOR gate 218.

Figure 8:
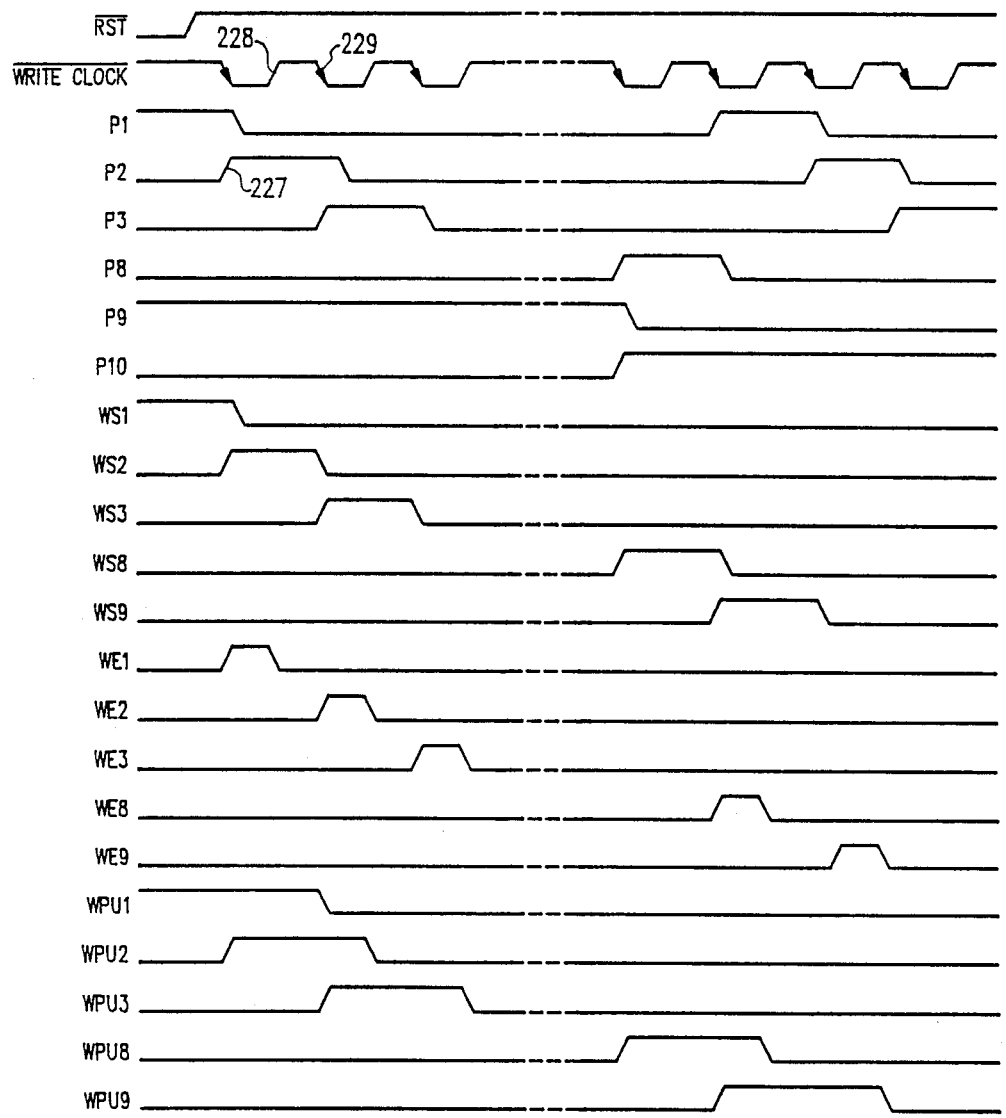
FIG. 8 is a timing diagram illustrating the operation of the write pointer shown in FIG. 7.

As illustrated by the timing diagram shown in FIG. 8, the selected write select line 212 (WSn) will be high during a substantially different time than the selected write enable line 220 (WEn). The write power-up signal (WPUn) generated on the selected line 226 will be equivalent to the OR of the corresponding write select line WSn and the write enable line WEn, and will show, after one gate delay, transitions corresponding to the beginning transition of the corresponding WS signal and the ending transition of the corresponding WE signal.

The write pointer 34 of the invention also incorporates an architecture whereby the write pointer is simultaneously incremented to the next location while the memory word at the last-pointed location is being written into.

Referring to both FIGS. 7 and 8 to illustrate the simultaneous memory write technique, P2 is high at a time 227 responsive to the lower-order "one" bit being stored in register 194, and P9 is high responsive to the higher-order "one" bit being stored in register 205. This condition selects the WS2 gate, and the WS2 signal will therefore go high after a relatively small gate delay. A high signal is simultaneously transmitted on the respective write signal line 212 to WPU2 gate 224. The WPU2 signal will also therefore go high.

The high WS2 signal is stored in the WS2 latch 214 responsive to a $\overline{\text{WRITE CLOCK}}$ pulse at time 228. This will in turn cause a low state to appear on latch output line 216.

The next low-going transition of the $\overline{\text{WRITE CLOCK}}$ pulse appears at time 229. This pulse will cause the WE2 gate 224 to transmit high states on WE2 line 220 and signal line 222. At the same time, however, the "one" lower-order address bit is being incremented from flip-flop 194 to flip-flop 195. Responsive to this, WS2 and line 212 will go low while WS3 goes high. Thus, a write enable operation (n) is performed at the same time that the write address is incremented to a next address (n+1).

Figure 9:
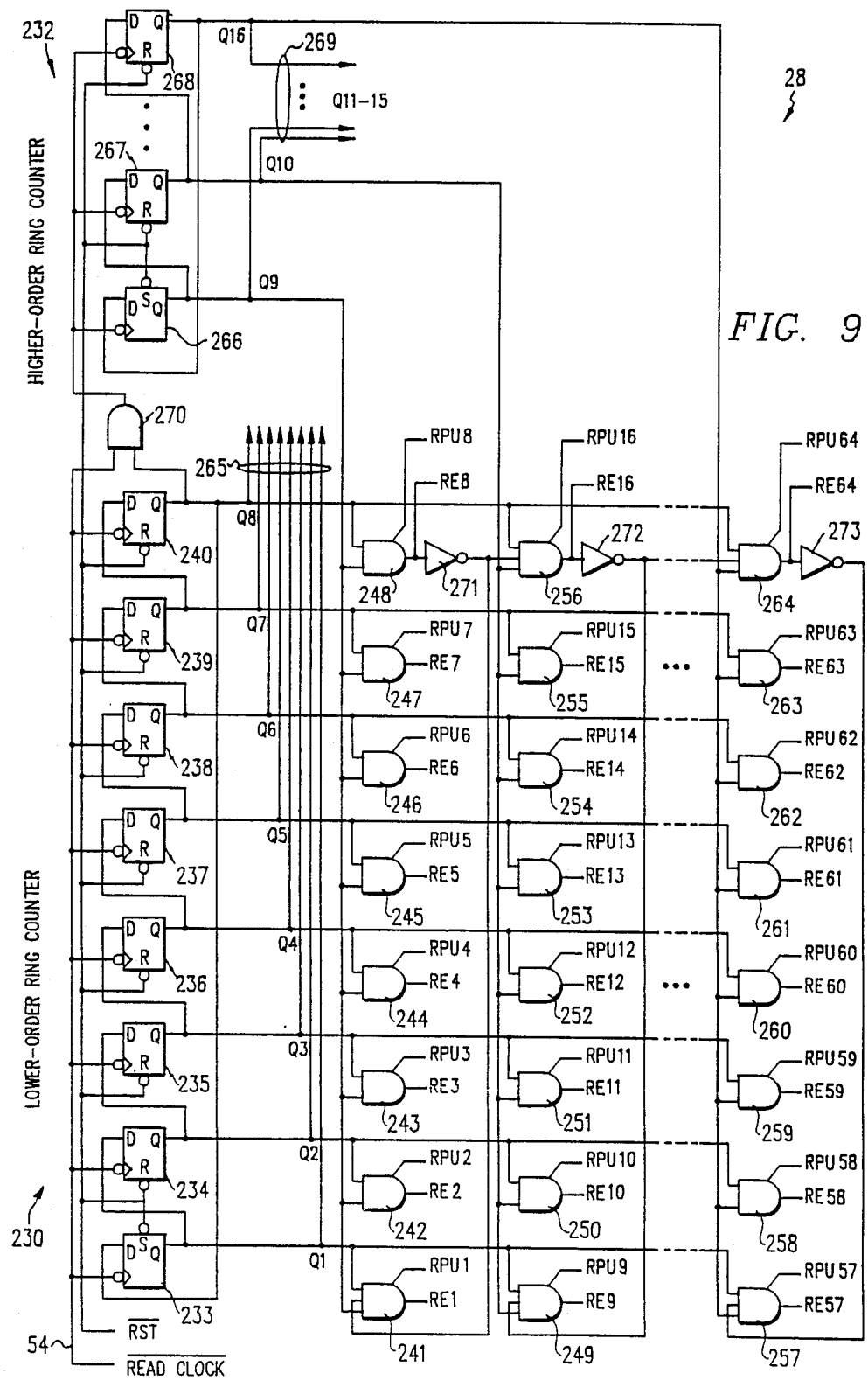
FIG. 9 is a detailed schematic electrical diagram of the read pointer shown in FIG. 1.

Turning now to FIG. 9, a logic diagram of read pointer 28 is illustrated. Read pointer 28 is in general organized similarly to write pointer 34 (FIG. 7). Read pointer 28 has a two-tier ring counter that is comprised of a lower-order ring counter or address digit register 230 and a higher-order ring counter or address digit register 232. Lower-ring counter 230 is comprised of a plurality of flip-flops or stages 233–240, including a first stage 233 and a last stage 240. Each stage 233–240 has a Q output connected to the D input of the next succeeding stage, with the Q output of last stage 240 being connected to the D input of stage 233, thus forming a ring. Each stage 234–240 has a reset input connected to $\overline{\text{RST}}$. $\overline{\text{RST}}$ is connected to a "set" input of stage 233. Each stage 233–240 has a clock input that is actuated by a descending transition of the $\overline{\text{READ CLOCK}}$ signal as input on line 54 from write/read controller 48 (FIG. 1).

Each lower-order stage 233–240 has a respective output line Q1–Q8. Output signal lines Q1–Q8 are each connected to selected ones of a plurality of read enable gates 241–264, which are conceptually arranged in a two-dimensional matrix of rows and columns. Each one of output lines Q1–Q8 is connected to the inputs of each read enable gate in a particular row. Each output Q1–Q8 is further output on a line 265 to pointer comparator 44 (FIG. 1), lines 265 comprising a portion of read address bus 40.

The organization of higher-order read counter 232 is in general similar to the organization of lower-order ring counter 230. Higher-order ring counter 232 comprises a series of stages or flip-flops 266, 267 . . . 268. Although eight higher-order stages are provided in the preferred embodiment, only three are shown for purposes of brevity.

As in lower-order stages 233–240, stages 266–268 each have a Q output that is connected to the D input of the next succeeding stage 266–268. The Q output of a last higher-order stage 268 is connected to the D input of a first higher-order stage 266, thus forming a higher-order ring of stages. The reset input of each of stages 267–268 is connected to the $\overline{\text{RST}}$ signal line. Stage 268 has a "set" terminal that is connected to the $\overline{\text{RST}}$ source. Therefore, a low-going transition of $\overline{\text{RST}}$ will reset stages 234–240 and 267–268, such that "zero" bits will be stored therein, and will set stages 233 and 266, such that "one" bits will be stored therein.

A plurality of outputs Q9–Q16 are output from respective stages 266–268, each to one of a plurality of columns of read enable AND gates 241–264. Each line Q9–Q16 is connected to each AND gate in a respective column. Only three such columns are shown, it being understood that in the preferred embodiment, eight such columns, each containing eight read enable AND gates for a total of 64 AND gates, are provided. Outputs Q9–Q16 are further output on respective read address lines 269 to pointer comparator 44 (FIG. 1) as a portion of bus 40.

The Q output of the last lower-order stage 240 is connected as an input to an AND gate 270. Another input of AND gate 270 is connected to $\overline{\text{READ CLOCK}}$ line 54. The output of AND gate 270 is connected to the clock input of each of stages 266–268. Read pointer 28 therefore acts as a two-tier counter similar to write pointer 34. A "one" bit is initialized in stage 233, and is transferred to an adjacent stage 234 upon each low-going pulse on $\overline{\text{READ CLOCK}}$ line 54, as is shown in the read pointer timing diagram of FIG. 10. When a "one" bit is stored in stage 240, the next low-going transition of the $\overline{\text{READ CLOCK}}$ signal will cause a "one" bit initially stored in higher-order stage 266 to be transferred to the adjacent higher-order stage 267.

Each column of read enable AND gates 241–264 has a first AND gate 241, 249 . . . 257 and a last AND gate 248, 256 . . . 264. Each read enable gate has a read enable output RE1–RE64, and a read power-up output RPU-1–RPU64. Outputs RE8, RE16 . . . RE64 are each further connected to a respective inverter 271, 272 . . . 273. The output of each inverter 271–273 is connected to the input of the last AND gate 256–264 in the adjacent column. The output of each inverter 271–273 is further input into an input of a respective first read enable gate 241, 249 . . . 257 in each column.

In operation, read pointer 28 operates in much the same manner as write pointer 34 (FIG. 7). Referring both to FIG. 9 and the read pointer timing diagram shown in FIG. 10, a high state on one of higher-order address lines Q9–Q16 will combine with high state on one of lower-order address lines Q1–Q8 to select one of the 64 read enable gates 241–264. Each read enable gate is operable to output a high READ ENABLE (RE) signal on a respective READ ENABLE line. Each read enable gate is further operable to transmit a READ POWER-UP (RPU) signal on a respective read power-up line.

The presence of inverter gates 271–273 on last read enable gates 248, 256 . . . 264 resolves a decoding glitch that would otherwise occur. This can be best illustrated by an example as shown in the timing diagram illustrated by FIG. 10. Suppose that read enable gate 248 has been selected, as would occur at time 274 on FIG. 10. Read enable gate 248 is selected when both Q8 and Q9 are high. Upon the next low-going transition of $\overline{\text{READ CLOCK}}$ at time 275, lines Q1 and Q10 will go high, but lines Q8 and Q9 would not yet have gone low. Thus, the read enable gates 241, 248, 249 and 256, corresponding to each possible combination of lines Q1, Q8, Q9 and Q10, will be high at the same time. High signals will therefore appear simultaneously on READ ENABLE lines RE1, RE8, RE9, and RE16. While it is permissible to have the memory location that is now being read (RE8) high at the same time as addressing the next memory location (RE9), it is not desirable to have other memory locations (RE1, RE16) selected.

Figure 10:
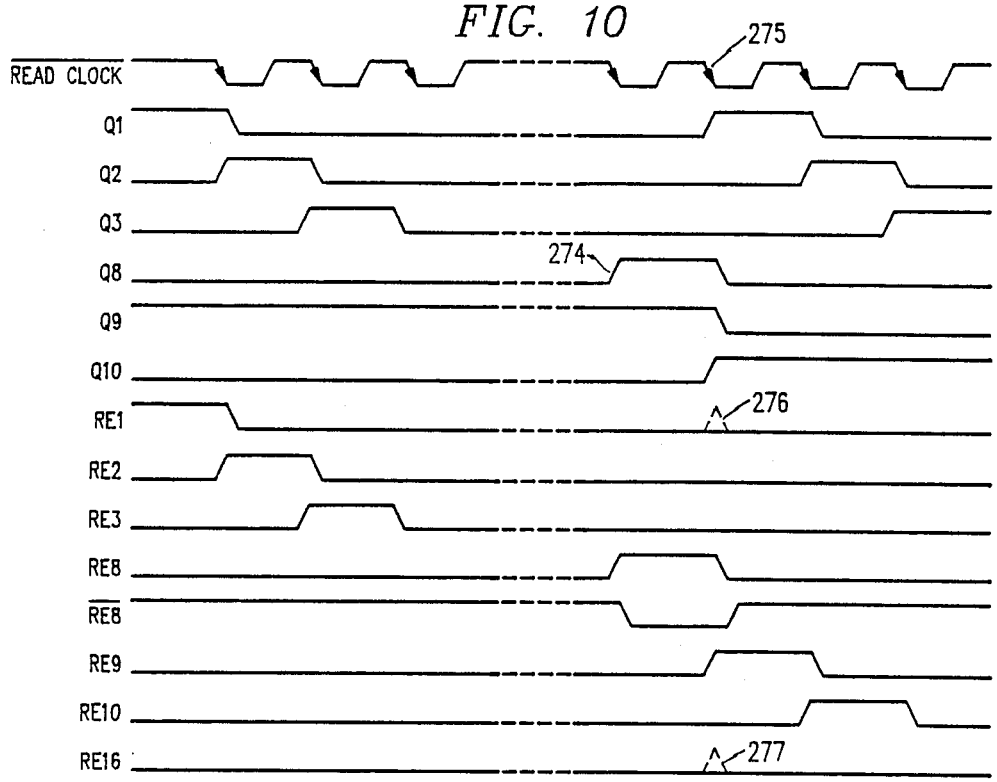
FIG. 10 is a timing diagram illustrating the operation of the read pointer shown in FIG. 9.

Since RE1 and RE16 would temporarily be high, a glitch would occur at 276 and 277 as shown in phantom on FIG. 10. This glitch is eliminated by the connection of an inverter 271-273 to the output of the last READ enable gate 248, 256 ... 264 in each column. The output of the inverter is then connected to the first gate in each column, and the last gate in an adjacent column. In the illustrated example, gates RE1 (241) and RE16 (256) would be pinned low by the action of inverter gate 271 such that glitches 276 and 277 shown on FIG. 10 would not be allowed to happen.

The read and write pointer organization of the invention is not limited to two tiers of eight flip-flops each, but can conceptually be extended to a multiple number of tiers having the same or a different number of flip-flops. However, for operation of the preferred comparator 44 of the invention (FIGS. 1. 15a and 15b), it is preferred that: (a) the number of tiers of the read pointer 28 equal the number of tiers of the write pointer 34; (b) that the number of stages 233-240 in lower-order read ring counter 230 equal the number of stages 193-200 of lower-order write ring counter 190 (FIG. 7); and that (c) the number of higher-order read ring counter stages 266-268 (FIG. 8) be equal to the number of higher-order write ring counter stages 205-207 (FIG. 7).

Figure 11A:
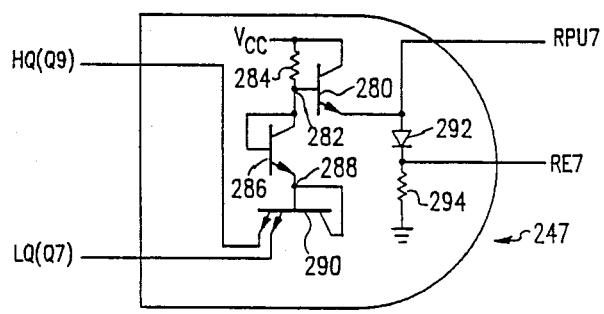
FIG. 11a is an electrical schematic diagram of a read enable NAND gate for use with the read pointer shown in FIG. 9.

Turning now to FIG. 11a, a selected read enable gate 247 is shown in more detail. Gate 247 comprises a first bipolar transistor 280 having a collector connected to a voltage supply $V_{CC}$, a base connected to a node 282, and an emitter connected to a read power-up line, in this instance RPU7. Node 282 is connected to voltage supply $V_{CC}$ via a resistor 284. Node 282 is further connected to a bipolar transistor 286 that has its base shorted to its collector, thereby acting as a diode. The emitter of transistor 286 is connected to a node 288. Node 288 is connected to both the collector and the base of a multiple-emitter bipolar transistor 290. A first emitter of transistor 290 is connected to a higher-order read ring counter output line, in this case Q9. Another emitter of transistor 290 is connected to a lower-order read ring counter output line, in this case Q7.

The emitter of transistor 280 is further connected to a diode 292. Diode 292 connects the emitter of transistor 280 to a READ enable line, in this case line RE7. READ enable line RE7 is further connected via a resistor 294 to ground. In their active states, the voltage on read enable line RE7 will be less than the voltage on read power-up life RPU7.

In operation, if either line Q7 or line Q9 are low, then current will flow from $V_{CC}$ through resistor 284 and transistor 286 to the low line. If, on the other hand, both of the input lines Q7 and Q9 are high, current will flow through the emitter of transistor 280 and charge up the read power-up line RPU7. Current will also flow through diode 292 to pull the read enable line RE7 high.

Figure 11B:
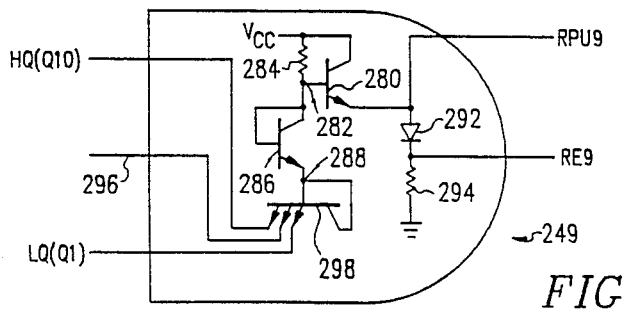
FIG. 11b is an electrical schematic diagram of another read enable NAND gate for use with the read pointer shown in FIG. 9.

FIG. 11b is a schematic electrical diagram of a selected three-input READ enable gate 249. The construction of gate 249 is in general similar to the construction of gate 247, with the exception of an additional input 296 to a third emitter of three-emitter transistor 298. Input 296 is connected to the output of inverter 272 (FIG. 9). Either gate 247 (FIG. 11a) or gate 249 (FIG. 11b) is operable to transmit a read power-up signal (RPU) simultaneously with the transmission of a read enable signal (RE). The remaining read enable gates are similar to either gate 247 or gate 249 in construction.

Figure 12:
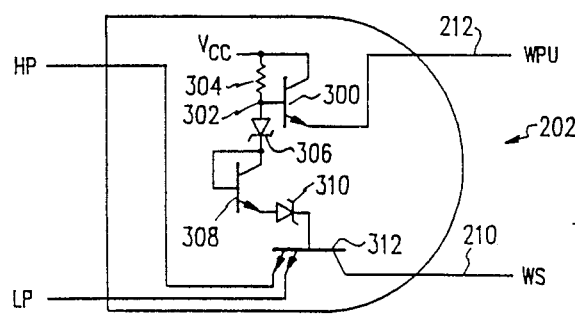
FIG. 12 is an electrical schematic diagram of a write select and power-up NAND gate for use with the write pointer shown in FIG. 7.

Turning now to FIG. 12, a schematic electrical diagram of one of write enable gates 202 (FIG. 7) is illustrated. Gate 202 includes a first bipolar transistor 300 having a collector connected to voltage source VCC, a base connected to node 302, and an emitter connected to a write power-up (WPU) line 212. A resistor 304 connects node 302 to $V_{CC}$. Node 302 is further connected to the input of a diode 306. The output of diode 306 is in turn connected to the base and the collector of a bipolar transistor 308. Transistor 308 acts as a diode. The emitter of transistor 308 is connected to the input of a diode 310. The output of diode 310 is connected to a base of a multiple-emitter transistor 312. The collector of transistor 312 is connected to a write select line (WS) 210. A first emitter of transistor 312 is connected to a lower-order write address output line LP, and a second emitter of transistor 312 is connected to a higher-order address output line HP.

Write enable gate 202 operates in a manner similar to read enable gate 247 (FIG. 11a). If either of inputs HP or LP is low, current will flow from voltage source $V_{CC}$ through the circuit to the appropriate emitter of transistor 312. If, on the other hand, both HP and LP are high, current will flow from $V_{CC}$ through the emitter of transistor 300 to a write power-up line 212, and will further flow through the collector of transistor 312 to a write select line 210. A WPU signal and a WS signal are therefore generated simultaneously.

Figure 13:
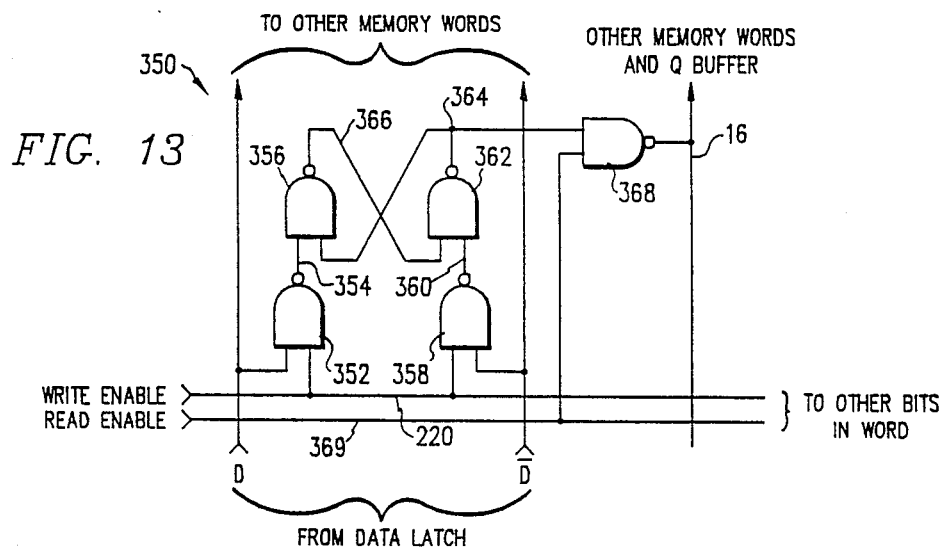
FIG. 13 is a logic diagram of a preferred memory cell for use with the invention.

Turning next to FIG. 13, a memory logic diagram of a selected cell in memory array 12 (FIG. 1) is illustrated. A memory cell, indicated generally at 350, receives a data bit on complementary data inputs D and $\overline{D}$ from data latch section 18 (FIG. 1). A NAND gate 352 has a first input connected to true data input D and a second input connected to a write enable line 220. NAND gate 352 has an output 354 connected to an input of a second NAND gate 356. A third NAND gate 358 has a first input connected to write enable line 220 and a second input connected to complementary data input $\overline{D}$. NAND gate 358 has an output 360 connected to an input of a fourth NAND gate 362. NAND gate 362 has an output connected to a node 364. Node 364 is cross-coupled to an input of NAND gate 356. The output of NAND gate 356 appears on line 366, and is cross-coupled to an input of NAND gate 362.

Node 364 is further connected as an input to a fifth NAND gate 368. A second input of NAND gate 368 is connected to a read enable line 369. The output of NAND gate 368 is connected to a data output line 16, which in turn is connected to a respective stage in Q buffer section 22 (FIG. 1).

Figure 14:
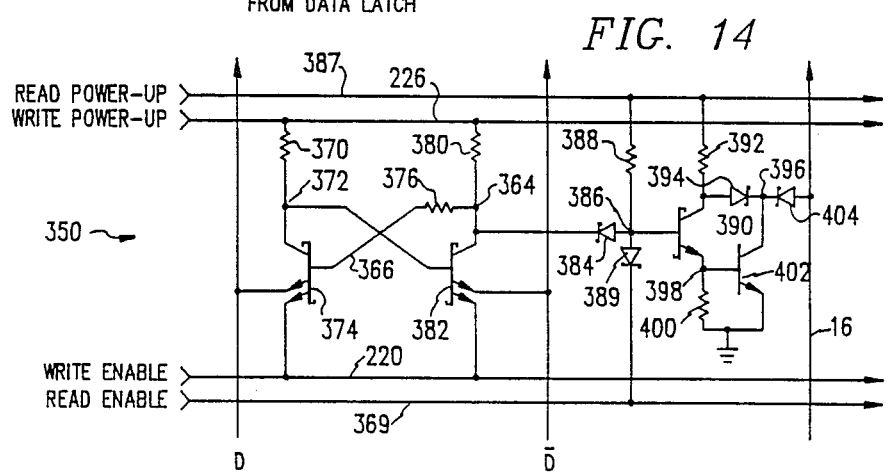
FIG. 14 is a schematic electrical diagram corresponding to the logic diagram of FIG. 13.

Referring next to FIG. 14, a detailed schematic electrical diagram corresponding to FIG. 13 is shown. Where possible, like numbers identify like components. A write power-up line 226 is connected to each cell 350 in that word. In each cell, write power-up line 226 is connected via a resistor 370 to a node 372. Node 372 is connected to a collector of a double-emitter bipolar Schottky transistor 374. A first emitter of transistor 374 is connected to a true data bit line D, and a second emitter of transistor 374 is connected to write enable line 220. The base of transistor 374 is connected via a resistor 376 to a node 364. Node 364 is connected via a resistor 380 to write power-up line 226. Node 364 is connected to the collector of a second double-emitter bipolar Schottky transistor 382. The base of transistor 382 is connected to node 372. A first emitter of transistor 382 is connected to a complementary data bit line $\overline{D}$. A second emitter of transistor 382 is connected to write enable line 220.

Node 364 is connected to the output of a Schottky diode 384. The input of diode 384 is connected to a node 386. Node 386 is connected to a read power-up line 387 through a resistor 388. The input of a further diode 389 is also connected to node 386. The output of node 389 is connected to read enable line 369. Diode 389 is provided to discharge node 386 after a read operation has occurred.

Node 386 has a final connection to a base of a bipolar Schottky transistor 390. The collector of transistor 390 is connected via a resistor 392 to read power-up line 387. The collector of transistor 390 is further connected to the input of a Schottky diode 394. The output of Schottky diode 394 is connected to a node 396. The emitter of bipolar transistor 390 is connected to a node 398. Node 398 is connected via a resistor 400 to ground, and is further connected to the base of another bipolar transistor 402. The collector of transistor 402 is connected to node 396. The emitter of transistor 402 is connected to ground.

Node 396 is further connected to the output of a Schottky diode 404. The input of Schottky diode 404 is connected to read output line 16.

In operation, a memory bit is written into cell 350 by placing complementary data on the D and $\overline{D}$ data bit lines. Then, a positive-going pulse is placed on write enable line 220. Current will therefore not be able to be sinked through the connected emitters of transistors 374 and 382 to the high write enable line. Depending on whether D or $\overline{D}$ is low, current will flow through one of transistors 374 and 382 to the low data bit line, turning the other one off. Write power-up line 226 is previously made high to initially pull both nodes 372 and 364 to a high enough voltage for the write operation to occur. All nine bits of the selected word are in this manner loaded simultaneously into respective cells 350 in that word.

To read a data bit, read enable line 369 of the selected word is taken high along with read power-up line 387. At this time, transistor 382 will either be on or off depending on whether a "one" or a "zero" bit is currently being stored. If transistor 382 is on, current will flow from read power-up line 387 through resistor 388, diode 384 and transistor 382 to write enable line 220. The base of transistor 390 will therefore be low, and transistors 390 and 402 will be turned off. Node 396 will therefore be high, and therefore a high state will be sensed on read output line 16.

If however transistor 382 is turned off, diode 384 will be reverse biased and transistor 390 will be turned on. This in turn turns on transistor 402, pulling node 396 low. The voltage on line 16 will then also be pulled low, communicating a "zero" bit to the output.

The outputs of all 64 read-enable AND gates in that bit position are wire-ANDed together, and act to drive the inputs of the nine three-state Q buffers 22 (FIG. 1). The D and $\overline{D}$ lines are outputs of the nine data latches comprising data latch section 18 (FIG. 1).

The data are latched into latch section 18 (FIG. 1) when either the DATA ENABLE signal is low, or the $\overline{\text{WRITE CLOCK}}$ signal is low (FIG. 1). This allows for a very short data hold time and assures that valid data are held on the D and $\overline{D}$ lines until a write operation is completely finished into a selected row of cells 350.

A technical advantage of the invention is presented in that the only memory cells 350 completely powered up are the cells currently being read out of and written into, and the cells comprising the next word to be written into. This allows for a considerable power savings. A memory cell 350 requires only minimal power to store a data bit, but in order for a write to occur in a very short time, its write power-up line 226 must be taken high. As described above, the cells 350 of a memory word are powered-up for a write either when that word is the next one selected for a write operation, but when the write is not yet occurring; or during the write operation while the write-enable line 220 for that word is high. This ensures that the selected cells 350 are powered-up well in advance of being written into, and that the cells 350 remain powered up throughout the entire write cycle. In operation, WRITE power-up line 226 is normally at a relatively low voltage, such as 2 volts, in order to retain a memory bit within cross coupled transistors 374 and 382. When it is desired or a particular cross-coupled transistor pair to be written into, the write power-up line 226 is increased to $V_{CC}$ minus some threshold voltage. This biases transistors 374 and 382 sufficiently that a new data bit can be written in from true or complementary bit lines D and $\overline{D}$.

The addressable READ power-up line 387 is used in such a way that only that row of cells that is to be read consumes a large amount of power. Referring back to FIG. 13, this presents an advantage over the prior art in that the fall-through time of the write operation is decreased. In prior art designs, when write enable line 220 went high, all of the read gates 368 were disabled, such that the outputs of all gates 368 were high. The output 16 did not go into its final state until the WRITE enable line went low. The circuitry of the present invention as shown in FIG. 14 avoids the increased fall-through time associated with these prior art designs.

Figure 15A:
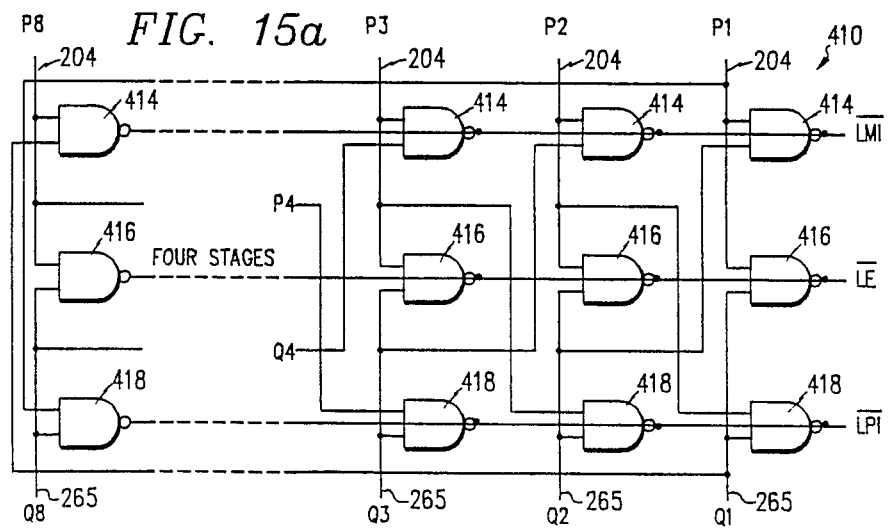
FIG. 15a is a logic diagram of a lower-order address digit comparator according to the invention.
Figure 15B:
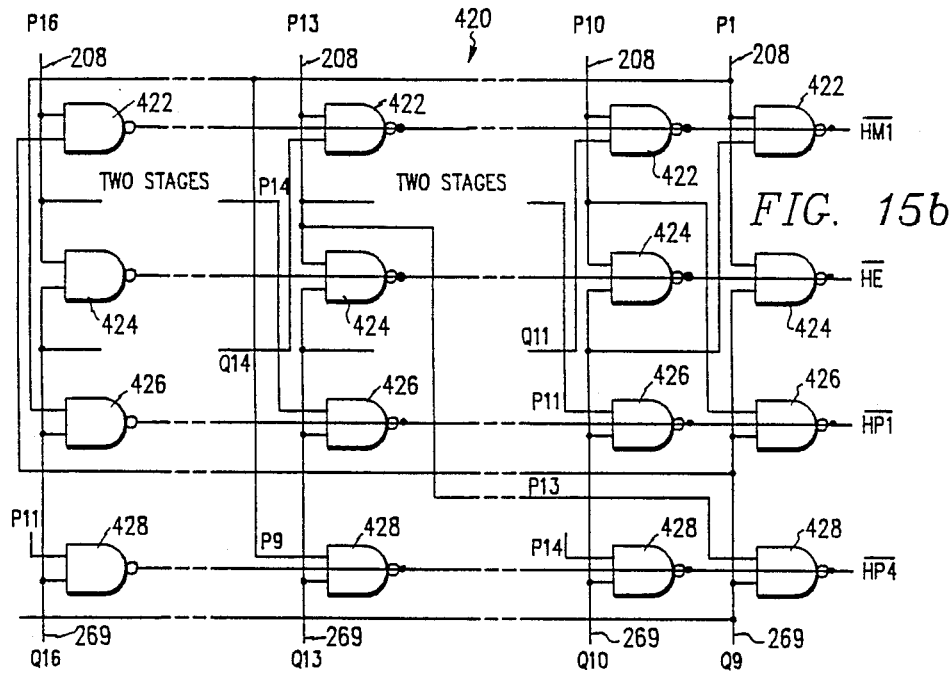
FIG. 15b is a logic diagram of a higher-order address digit comparator according to the invention.

Referring now to FIGS. 15a and 15b, ring counter comparator 44 is described in more detail with the aid of logic diagrams. FIG. 15a illustrates a lower-order ring counter comparator, indicated generally at 410. Comparator 410 comprises a plurality of NAND gates 414-418 arranged in a matrix. The matrix has a plurality of inputs Q1-Q8 (265) that are the same as address lines 265 in FIG. 9 and which are output from respective lower-order read flip-flop stages 233-240. An analogous set of inputs P1-P8 (204), are the same as address lines 204 as shown in FIG. 7 and are output from respective lower-order write stages or flip-flops 193-200. At any time during operation, one of lines P1-P8 will be high, and one of lines Q1-Q8 will be high.

The matrix of NAND gates 414-418 is comprised of a first row of NAND gates 414, a second row of NAND gates 416, and a third row of NAND gates 418. Each NAND gate 414 compares a lower-order write address line P(n) with a lower-order read address line Q(n+1). Thus, the right-most NAND gate 414 compares the state of write address line P1 with read address line Q2.

In the second row, each NAND gate 416 compares the state of a selected lower-order write address line P(n) with the state of a lower-order read address line Q(n) For example, one gate 416 compares the state of a write pointer line P2 with the state of a read pointer line Q2. Finally, each of the third set of NAND gates 418 compares the state of a selected lower-order write address line P(n) with a lower-order read address line Q(n−1). Thus, for the right-most NAND gate, the state of write pointer line P2 is compared against the state of lower-order read address line Q1. The comparisons wrap around such that, for example, a gate 414 is provided to compare the state write address line P8 with that of read address line Q1.

An intermediate signal line $\overline{LM1}$ is connected to the output of each gate 414. A low signal on the $\overline{LM1}$ line will result if a high state of any P(n) line is matched with a high state of any Q(n+1) line. In a similar manner, a line $\overline{LE}$ is connected in parallel to the outputs of each gate 416. Line $\overline{LE}$ will be low if a P(n) and a Q(n) are both high, indicating a match in the lower-order ring counter position or address digit. The output of NAND gates 418 are connected in common to an $\overline{LP1}$ line. $\overline{LP1}$ will be in a low state if any combination P(n)Q(n−1) is high.

The remainder of ring counter comparator 44 (FIG. 1) is illustrated by the logic diagram shown in FIG. 15b. FIG. 15b shows a higher-order ring counter comparator indicated generally at 420. Higher-order ring counter comparator 420 is comprised of a first array of NAND gates 422, a second array of NAND gates 424, a third array of NAND gates 426, and a fourth array of NAND gates 428. The higher-order ring counter comparator 420 receives as inputs each of the higher-order write ring counter address lines P9–P16 (208), and each of the higher-order read ring counter address lines Q9–Q16 (269).

Gates 422 find the inverse product of each combination of P(n)Q(n+1). For instance, the right-most gate 422 compares the state of signal line P9 to the state of signal line Q10. Each gate 422 is connected in common to an $\overline{HM1}$ signal line. In a similar manner, gates 424 compare each possible combination of P(n)Q(n), and the output of each NAND gate 424 is connected in common to a signal line $\overline{HE}$. Gates 426 are provided to find the inverse products of P(n)Q(n−1), and their outputs are connected in common to a signal line $\overline{HP}$.

Gates 422, 424 and 426, and their outputs $\overline{HM1}$, $\overline{HE}$ and HP1 are higher-order analogs of lower-order gates 414, 416 and 418, and the outputs $\overline{LM1}$, $\overline{LE}$ and $\overline{LP1}$ (FIG. 15a). Higher-order comparator 420 however has in addition a linear array of gates 428 that find the inverse product of P(n)Q(n−4). Thus, the right-most gate 428 finds the inverse product of the states on line P13 and line Q9. Each gate 428 has an output connected in common to an intermediate signal line $\overline{HP4}$.

Gates 428 are provided to compare the state of each higher-order read address line P(n) with the higher-order write address line Q(n−4). If a high state of any combination thereof is found, it is an indication that the higher-order write address digit is displaced by one-half of the range of the higher-order digits from the higher-order read address digit. The write pointer will therefore be roughly 50% of the memory ahead of or behind the read pointer, in turn indicating a possible HALF-FULL memory condition. The empty capacity of the memory will range from 32 empty spaces to 24 empty spaces, eight being the range of the lower-order ring counters in the illustrated embodiment.

The illustrated embodiment, of course, is provided for a memory array of 64 words. If the memory had, for example, 100 words and the lower- and higher-order ring counters were organized in decimal stages, a series of gates would be provided to compare the state of each write higher-order write address line P(n) with the state of higher-order read address line Q(n−5). The gates would then produce a signal $\overline{HP5}$. In any case, the inputs to gates 428 should be provided such that an active signal will result when the higher-order write address digit is one-half of the array ahead of the read higher-order read address digit.

Signal lines $\overline{LM1}$, $\overline{LE}$, LP1, $\overline{HM1}$, $\overline{HE}$, $\overline{HP1}$ and $\overline{HP4}$ together comprise the intermediate signal bus 46 shown in FIG. 1.

Figure 16:
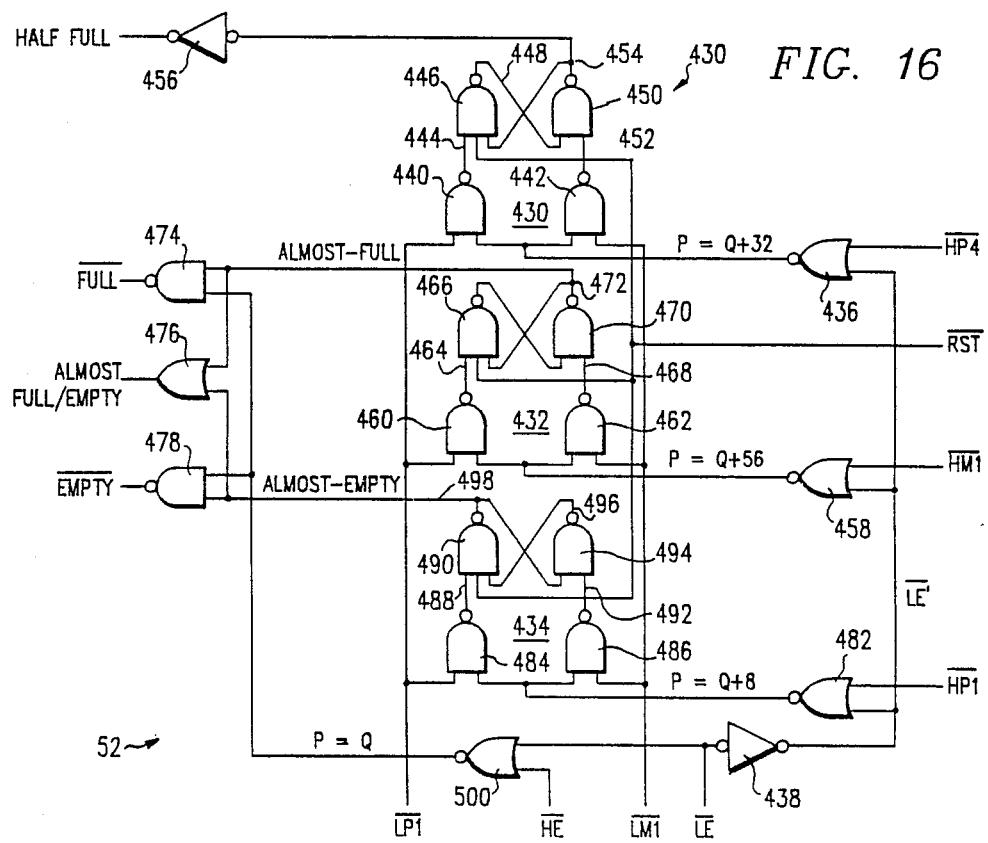
FIG. 16 is a detailed logic diagram of the status flag decoder shown in FIG. 1.

The intermediate signals are input into flag decoder 52, which is illustrated in more detail by the logic diagram of FIG. 16. In FIG. 16, flag decoder 52 is shown to be organized into three latches: a HALF-FULL latch 430, ALMOST-FULL latch 432, and an ALMOST-EMPTY latch 434. Latch 430 includes preliminary NOR gate 436 that finds the NOR of signal lines $\overline{HP4}$ and $\overline{LE'}$. Signal line LE' in turn is output from a double inverter 438. Inverter 438 in turn receives as its input an $\overline{LE}$ signal from lower-order ring counter comparator 410 (FIG. 15a). Double inverter 438 is provided to cause a delay in the application of the $\overline{LE}$ signal to NOR gates 436, 458 and 482, thereby preventing changing states from simultaneously appearing at both inputs of any of NAND gates 440, 442, 460, 462, 484 or 486. NOR gate 436 outputs a "P=Q+32" line that is connected as an input to each of pair of NAND gates 440 and 442. The "P=Q+32" line will be high when the read pointer is exactly half the memory array from the write pointer. NAND gate 440 receives as its other input the $\overline{LP1}$ signal line from lower-order ring counter, comparator 410 (FIG. 15a). Gate 442 has its other input connected to the $\overline{LM1}$ signal line.

NAND gate 440 has an output 444 that is connected as an input to a NAND gate 446. Another input of gate 446 is connected to $\overline{RST}$. The output 448 of gate 446 is cross-coupled over to an input of a further NAND gate 450. The output 452 of NAND gate 442 is connected to the other input of gate 450. An output 454 of gate 450 is cross-coupled over as an input to gate 446, and is further transmitted to a HALF-FULL inverter 456. The output of inverter 456 is operable to transmit a HALF-FULL flag to a connected device (not shown).

ALMOST-FULL latch 432 is organized in a manner similar to HALF-FULL latch 430. A preliminary NOR gate 458 has a first input connected to signal line $\overline{LE'}$ and a second input connected to the $\overline{HM1}$ signal line. NOR gate 458 produces as an output a "P=Q+56" signal line. The $\overline{HM1}$ signal will be low when the higher-order write pointer is one behind the higher-order read pointer, indicating that eight or less words separate the write pointer from the read pointer. $\overline{LE'}$ will be low when the lower-order pointers are equal to each other. Therefore, when the output of NOR gate 458 will go high responsive to the write pointer being 56 ahead of, or 8 behind, the read pointer.

The P=Q+56 line is connected as an input into a first NAND gate 460 and a second NAND gate 462. NAND gate 460 also receives an $\overline{LP1}$ input, and NAND gate 462 receives an $\overline{LM1}$ input. Gate 460 has an output 464 that is connected as an input to a NAND gate 466. NAND gate 462 has an output 468 that is connected to an input of a NAND gate 470. Gate 470 has an output 472 that is applied as an ALMOST-FULL signal to a NAND gate 474, an OR gate 476. Output 472 is further cross-connected as an input to NAND gate 466. NAND gate 466 has an output 480 that is crossconnected as an input to gate 470. Gate 466 has a third input that is connected to $\overline{RST}$.

ALMOST-EMPTY latch 434 includes a NOR gate 482 that has as its inputs the $\overline{HP1}$ and the $\overline{LE}'$ signal. $\overline{HP1}$ will be low responsive to the higher-order read pointer is one behind the higher-order write pointer, indicating that the selected read address is between one and fifteen words behind the write address. $\overline{LE}'$ is low responsive to the lower-order read and write pointers being equal. Therefore, the output of NOR gate 482 will be high when the write pointer is exactly eight addresses behind the read pointer (P=Q+8).

The P=Q+8 signal line is connected as an input to a NAND gate 484 and a NAND gate 486. Gate 484 also receives as an input the $\overline{LP1}$ signal line and gate 486 receives as an input the $\overline{LM1}$ signal line. NAND gate 484 has an output 488 that is connected as an input to a NAND gate 490. Gate 486 has an output 492 that is connected as an input to NAND gate 494. NAND gate 494 has an output 496 that is cross-coupled as an input to gate 490. Gate 490 further receives as an input $\overline{RST}$. Gate 490 has an output 498 that is crossconnected as an input to gate 494, and further is connected to an ALMOST-EMPTY signal line. The ALMOST-EMPTY signal line is connected as an input to an $\overline{EMPTY}$ NAND gate 478 and ALMOST-FULL/EMPTY NOR gate 476.

Apart from latches 430, 432 and 434, flag decoder 52 is provided with a NOR gate 500 that receives as inputs the $\overline{LE}$ and $\overline{HE}$ signal lines. Gate 500 outputs the P=Q signal line 50. When both $\overline{HE}$ and $\overline{LE}$ are low, a high output will result on P=Q signal line 50. The P=Q signal line 50 is input into $\overline{EMPTY}$ NAND gate 478 and $\overline{FULL}$ NAND gate 474 and is further input into write/read control section 48 (FIGS. 1 and 2).

Flag decoder 52 is operable to produce four flags for connection to exterior devices: HALF-FULL, $\overline{FULL}$, ALMOST-FULL/EMPTY, and $\overline{EMPTY}$. The ALMOST-FULL/ALMOST-EMPTY flag can be used in place of two separate ALMOST-FULL and ALMOST-EMPTY flag signals because the condition of the HALF-FULL flag allows the connected device (not shown) to discriminate between these two conditions.

Flag decoder 52 operates in general as follows. The generated equality signals P=Q+32, P=Q+56 and P=Q+8 are each used to enable a respective cross-coupled latch 430, 432 and 434. The other two decoded signals, $\overline{LM1}$ and $\overline{LP1}$, determine if the next operation after any of the above three conditions is a read or a write. This determines the state of the latch after the condition.

Figure 17:
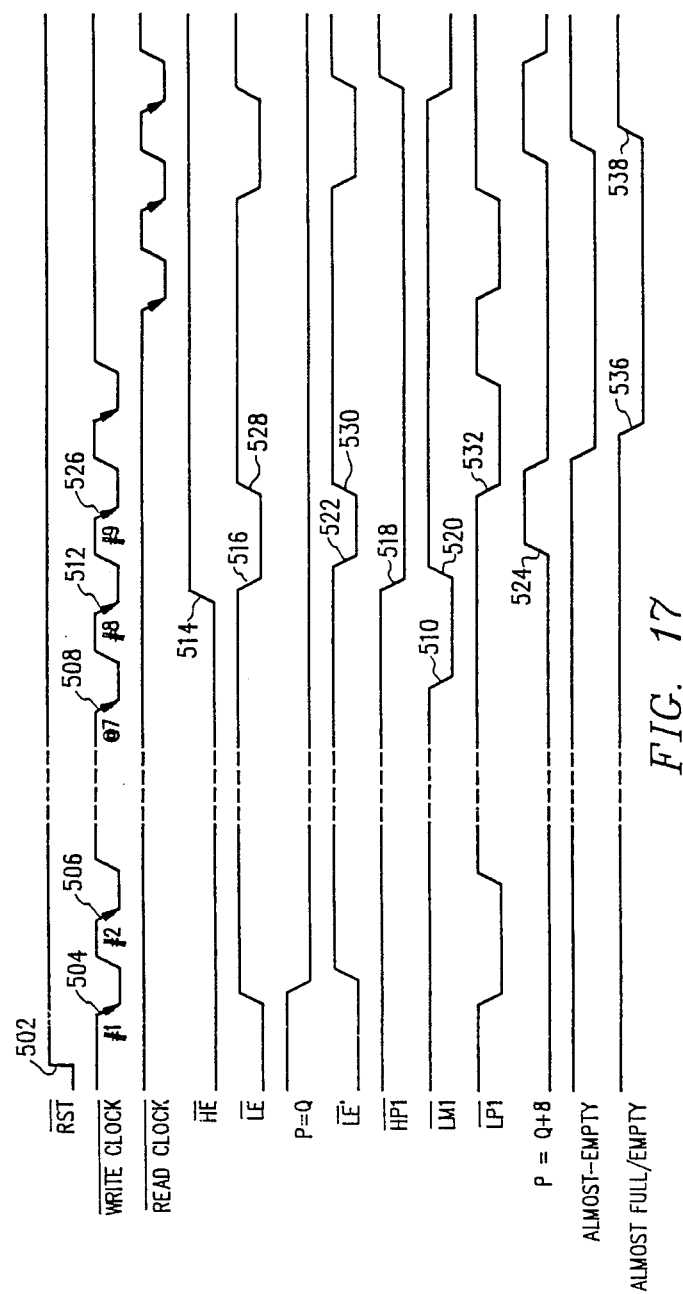
FIG. 17 is a timing diagram showing the operation of the flag decoder illustrated in FIG. 16.

The operation of flag decoder 52 can be particularly illustrated by use of an example as diagrammed by the signal timing diagram of FIG. 17 when taken in conjunction with the logic diagram of FIG. 16. At the start of this example, the $\overline{RST}$ signal is low, resetting each of latches 430, 432 and 434. The HALF-FULL latch 430 and the ALMOST-FULL latch 432 are reset to a low state, while the ALMOST-EMPTY latch 434 is reset to a high state. This occurs at time 502 (FIG. 17).

Assume next that a series of data words are written into successive locations of the array, and none are read out for several clock cycles. At time 502, the read pointer and the write pointer will each be set to position "11". Therefore, the $\overline{HE}$ and the $\overline{LE}$ signals will be low, and the P=Q signal will be high. $\overline{LE}'$ will also be low, while difference signals $\overline{HP1}$, $\overline{LM1}$ and $\overline{LP1}$ will all be high to indicate that their respective triggering conditions have not occurred. Intermediate equality signal P=Q+8 will be low. The ALMOST-EMPTY flag signal is reset high, and therefore the ALMOST-FULL/EMPTY flag is also in a high condition at this point.

A first low-going transition of $\overline{WRITE\ CLOCK}$ occurs at time 504. Responsive to this $\overline{WRITE\ CLOCK}$ pulse, the lower-order write ring counter will advance from "1" to "2". Since the lower order read address digit no longer equals the lower order write address digit, the $\overline{LE}$ signal will go high as will LE' after a delay. The read pointer and the write pointer are no longer at the same address location, so signal P=Q goes low. Since the WRITE pointer is now 1 ahead of the READ pointer, the $\overline{LP1}$ signal will be triggered to go low. The $\overline{LP1}$ signal goes back high a short time after the second low-going transition of WRITE CLOCK at time 506.

In the example, several $\overline{WRITE\ CLOCK}$ transitions next occur without any intervening $\overline{READ\ CLOCK}$ transitions. After the seventh WRITE CLOCK transition at 508, $\overline{LM1}$ will go low at time 510. Referring to FIG. 16, both inputs of NAND gate 486 will now be low.

Next, the eighth consecutive WRITE CLOCK transition occurs at time 512. This will cause the higher-order write ring counter to increment from P9 to P10 (FIG. 7), while the higher-order read ring counter remains at Q9 (FIG. 9). Since the higher-order ring counters are no longer equal to each other, $\overline{HE}$ goes high at time 514. The lower-order write ring counter has advanced all the way around to its original value of "1", and thus, is once again equal to the lower-order read ring counter. Therefore, $\overline{LE}$ goes low at time 516. Signal $\overline{HP1}$ will go low responsive to P10 and Q9 both being in the high state at time 518. Shortly thereafter, the $\overline{LM1}$ signal will go high at time 520. Since $\overline{LE}$ went to low at time 516, LE' will follow at time 522.

Since both $\overline{HP1}$ and $\overline{LE}'$ have gone low, the P=Q+8 equality signal will go high in response at time 524. Both outputs of gate 486 (FIG. 16) will be high at this point, and thus the output 492 of gate 486 will go from high to low. Similarly, the output 488 of gate 484 will go from high to low, since both of the inputs of gate 484 are at this point high. The output 496 of gate 494 will go from low to high, and therefore, two out of three inputs of gate 490 will be high. Latch 434 is now ready to go from "1" to "0" as soon as line 488 shifts back from zero to one.

The next low-going transition of WRITE CLOCK occurs at time 526. The lower-order ring counters will no longer be equal to each other, and thus, $\overline{LE}$ will go high at time 528. Signal $\overline{LE}'$ will follow $\overline{LE}$ at time 530 after a short glitch-preventing delay. The lower-order write pointer is now one beyond the lower-order read pointer, so that signal $\overline{LP1}$ goes low at time 532. Responsive to $\overline{LP1}$ going low, output 488 of NAND gate 484 (FIG. 16) will go from zero to one. All inputs to NAND gate 490 are now high, and therefore, its output switches from high to low. The ALMOST-EMPTY flag signal line therefore changes from a high to low state, and this change is translated through OR gate 476 to an ALMOST-FULL/EMPTY flag low state at time 36. This indicates to the connected device that the FIFO is no longer in an ALMOST-EMPTY condition, i.e., more than eight words have been written into the device then have been taken out.

The above example illustrates how an equality condition signal, such as P=Q+8, is used to set up or enable latch 434 for a change in state, and how a subsequent signal such as LP1 is used to actually change the latch condition. The equality condition signal P=Q+8 establishes a numerical reference, while intermediate difference signal $\overline{LP1}$ and $\overline{LM1}$ establish the direction in which the difference in pointer addresses is moving.

The remainder of the timing diagram shown in FIG. 18 illustrates a timing sequence where several transitions of $\overline{READ\ CLOCK}$ occur without any intervening transitions of $\overline{WRITE\ CLOCK}$. Since successive read operations gradually deplete the number of words in the FIFO memory, this will eventually yield the return of an ALMOST-FULL/EMPTY flag in a high condition at time 538, if no intervening write operations have occurred.

The operation of the ALMOST-FULL and HALF-FULL latches 430 and 432 is similar to the operation of ALMOST-EMPTY latch 434. The ALMOST-FULL flag is used in connection with the P=Q signal to generate a $\overline{FULL}$ flag by NAND gate 474. The ALMOST-EMPTY flag is used in conjunction with the P=Q signal to generate an $\overline{EMPTY}$ flag at NAND gate 478.

In summary, a multiple-tier ring counter first-in, first-out FIFO memory has been disclosed. To conserve on the number of logic gates and inputs, the memory write address location and the memory read address location are ascertained with the aid of a read pointer having a higher-order read ring counter and a lower-order read ring counter, and a write pointer having a higher-order write ring counter, and a lower-order write ring counter. The positions of the higher-order and the lower-order ring counters are compared in order to generate a plurality of intermediate signals. These intermediate signals are used to efficaciously decode a plurality of flags from the device, including $\overline{FULL}$, $\overline{EMPTY}$, ALMOST-FULL/EMPTY, and HALF-FULL flags.

Further technical advantages of the invention are obtained by the individual power-up of each addressed memory word, rather than the power-up of all memory words at the same time. Write power-up circuitry is provided separate from the read power-up circuitry, such that the selected word locations will be powered-up by these separate circuits only when a write or read operation on the addressed word is selected. The static power consumption of the FIFO memory is therefore reduced.

The FIFO memory has the further technical advantage of a monostable multivibrator circuit that produces a pulse whose width is not affected by load capacitance or manufacturing variations of resistor or capacitor elements.

While preferred embodiments of the invention and their advantages have been described in the above detailed description, the invention is not limited thereto, but only by the appended claims.

What is claimed is:

1. A first-in, first-out memory, comprising:
   a memory having a plurality of write-addressable and read-addressable memory locations;
   a data input coupled to a plurality of data latches for writing data into at least one write-addressed memory location of said memory;
   a data output coupled to a plurality of output buffers for reading data from at least one read-addressed memory location of said memory;
   a write pointer for write-addressing said at least one write-addressed memory location, said at least one write-addressed location having an address represented by a plurality of write address digits, a write address digit register of said write pointer provided for storing each write address digit, said write pointer operable to address said write-addressed location responsive to said write address digit registers storing said respective write address digits;
   a read pointer for read-addressing said at least one read-addressed memory location, said at least one read addressed memory location having an address represented by a plurality of read address digits, a read address digit register in said read pointer provided for storing each of said read address digits, said read pointer operable to address said read-addressed location responsive to said read address read address digit registers storing respective read address digits;
   a status flag generator circuit receiving outputs from the read and write pointers operable to determine how many of the memory locations are presently storing data and to generate a plurality of status flags, each status flag generated responsive to the number of memory locations addressed by the read and write pointers.

2. The first-in, first-out memory of claim 1, wherein said status flag generator comprises a pointer comparator for comparing said write address digits to said read address digits, and operable to generates a plurality of intermediate signals based on selected numerical differences between said write address digits and said read address digits; and
   a flag decoder for receiving said intermediate signals and operable to generate therefrom a plurality of memory status flags, said status flags transmitted to said data latches and said output buffers for control of write and read operations.

3. The first-in, first-out memory of claim 2 wherein said flag decoder is operable to generate a HALF-FULL status flag for indicating that at least half of the memory locations in said memory have data stored therein.

4. The first-in, first-out memory of claim 2 wherein said write address digit registers comprise a lower-order write address digit register for storing a lower-order write address digit and a higher-order write address digit registers for storing a higher-order address digit;
   said read address digit registers comprising a higher-order read address digit register for storing a higher-order read address digit, and a lower-order read address digit register for storing a low-order read address digit;
   said pointer comparator operable to generate said intermediate signals based on comparisons between said lower-order write address digit and said lower-order read address digit, and between said higher-order write address digit and said higher-order read address digit.

5. The first-in, first-out memory of claim 4 wherein said flag decoder comprises a HALF-FULL status flag generator operable to generate a HALF-FULL status flag for indicating that at least half of said memory locations have data stored therein;
   said HALF-FULL flag generator comprising a first intermediate signal input from said pointer comparator that is in an active state responsive to said lower-order write address digit exceeding said lower-order read address digit by one;

a second intermediate signal from said pointer comparator input into said HALF-FULL flag generator and assuming an active state responsive to said lower-order write address digit being less than said lower-order read address digit by one;

a third intermediate signal from said pointer comparator input into said HALF-FULL flag generator and assuming an active state responsive to said higher-order write address digit displaced from the value of said higher-order read address digit by half of the possible range of said higher-order address digits;

a fourth intermediate signal from said pointer comparator input into said HALF-FULL flag generator and assuming an active state responsive to said lower-order write address digit equaling said lower-order read address digit;

a HALF-FULL equality signal generator receiving said third and fourth intermediate signals and outputting an active state of a HALF-FULL equality signal responsive to both said third and fourth intermediate signals being in an active state;

an inactive state of said second intermediate signal and a subsequent active state of said half-full equality signal causing said HALF-FULL flag to go from an inactive state to an active state, an active sate of said second intermediate signal and a subsequent inactive state of said HALF-FULL equality signal causing said HALF-FULL flag to go from an active state to an inactive state.

6. The first-in, first-out memory of claim 4 wherein said flag decoder comprises an ALMOST-FULL flag signal generator operable to generate an ALMOST-FULL flag signal for indicating that most of said memory locations have data stored therein;

said ALMOST-FULL flag signal generator comprising first intermediate signal input from said pointer comparator and that is in an active state when said lower-order write address digit exceeds said lower-order read address digit by one;

a second intermediate signal from said pointer comparator input into said ALMOST-FULL flag signal generator and assuming an active state responsive to said lower-order write address digit being less than said lower-order read address digit by one;

a third intermediate signal from said pointer comparator input into said ALMOST-FULL flag signal generator and assuming an active state responsive to said higher-order write address digit exceeding the value of said higher-order read address digit by one;

a fourth intermediate signal from said pointer comparator input into said ALMOST-FULL flag signal generator and assuming an active state responsive to said lower-order write address digit equaling said lower-order read address digit;

an ALMOST-FULL equality signal generator of said ALMOST-FULL flag signal generator coupled to said third and fourth intermediate signals and outputting an active state of an ALMOST-FULL equality signal responsive to both the third and fourth intermediate signals being in an active state; an inactive state of said second intermediate signal and a subsequent active state of said ALMOST-FULL equality signal causing said ALMOST-FULL flag signal to go from an inactive state to an active state, an active state of said second intermediate signal and a subsequent inactive state of said ALMOST-FULL equality signal causing said ALMOST-FULL flag signal to go from an active state to an inactive state.

7. The first-in, first-out memory of claim 4, wherein said flag decoder comprises an ALMOST-EMPTY flag signal generator operable to generate an ALMOST-ENTRY flag signal for indicating that most of said memory locations do not have data stored therein;

said ALMOST-EMPTY flag generator comprising a first intermediate signal input from said pointer comparator and assuming an active state responsive to said lower-order write address digit exceeding said lower-order read address digit by one;

a second intermediate signal input from said pointer comparator into said ALMOST-EMPTY flag generator and assuming an active state responsive to said lower-order write address digit being less than said lower-order read address digit by one;

a third intermediate signal from said pointer comparator into said ALMOST-EMPTY flag generator and assuming an active state responsive to said higher-order write address digit being less than the value of said higher-order read address digit by one;

a fourth intermediate signal input from said pointer comparator into said ALMOST-EMPTY flag generator and assuming an active state responsive to said lower-order write address digit equalling said lower-order read address digit;

an ALMOST-EMPTY equality signal assuming an active state responsive to both the third and fourth intermediate signals being in an active state;

an active state of said first intermediate signal and a succeeding inactive state of said ALMOST-EMPTY equality signal causing said ALMOST-EMPTY flag signal output to go from an active state to an inactive state, an inactive state of said first intermediate signal and an active state of said ALMOST-EMPTY equality signal causing said ALMOST-EMPTY flag signal output to go from an inactive state to an active state.

8. The first-in, first-out memory of claim 2 wherein said flag decoder is operable to generator an ALMOST-FULL flag signal for indicating that most of said memory locations have data stored therein.

9. The first-in, first-out memory of claim 8 wherein said ALMOST-FULL flag signal is generated responsive to predetermined states of a plurality of intermediate signal inputs from said pointer comparator.

10. The first-in, first-out memory of claim 8 wherein said write address digits include a lower-order write address digit, an active state of said ALMOST-FULL flag signal generated responsive to said write address equaling said read address minus a number within the possible range of said lower-order write address digit.

11. The first-in, first-out memory of claim 2 wherein said flag decoder is operable to generate an ALMOST-EMPTY flag signal for indicating that most of said memory locations do not have data stored therein.

12. The first-in, first-out memory of claim 11 wherein said ALMOST-EMPTY flag signal is generated responsive to predetermined state of a plurality of intermediate signals from said pointer comparator.

13. The first-in, first-out memory of claim 11 wherein said read address digits include a lower-order read address digit, said ALMOST-EMPTY flag signal generated responsive said write address exceeding said read address by a number within the possible range said lower-order read address digit.

14. The first-in, first-out memory of claim 11 wherein said flag decoder is operable to generator an ALMOST-FULL flag signal for indicating that most of said memory locations have data stored therein;

said flag decoder operable to generate a HALF-FULL status flag responsive to at least half of said memory locations having data stored therein;

an ALMOST FULL/EMPTY status flag output of said flag decoder being in an active state responsive to either an active state of said ALMOST-FULL flag signal or an active state of said ALMOST-EMPTY flag signal.

15. The first-in, first-out memory of claim 14 wherein said flag decoder is operable to generate an EMPTY status flag and a FULL status flag, said EMPTY status flag generated responsive to all of said memory locations having no data stored therein, said FULL flag signal generated responsive to all of said memory locations having data stored therein;

said write address digits and said read address digits each comprising lower-order and higher-order address digits, said point comparator operable to compare a higher-order write address digit to a higher-order read address digit, and a lower-order write address digit to a lower-order read address digit, a higher-order equality intermediate signal generated by said pointer comparator responsive to the equality of said higher-order write address digit with said higher-order read address digit, a lower-order equality intermediate signal generated by said pointer comparator responsive to said lower-order write address digit being equal to said lower-order read address digit;

an equality signal generated by said flag decoder responsive to active states of both said higher-order intermediate equality signal and said lower-order intermediate equality signal, said EMPTY status flag generated responsive to simultaneous active states of said equality signal and said ALMOST-EMPTY flag signal, said FULL flag generated responsive to simultaneous active states of said equality signal and said ALMOST-FULL flag signal.

16. The first-in, first-out memory of claim 1 wherein said read address digits and said write address digits each comprise lower-order and higher-order address digits, said write pointer and said read pointer each comprising:

a lower-order counter for storing a lower-order address bit at one of a plurality of address locations therein, each said address location representing a value of said lower-order digit;

a higher-order counter for storing a higher-order address bit at one of a plurality of higher-order address locations therein, each higher-order address location representing a value of said higher-order digit;

said higher-order address bit transferred form a current address location to a next address location responsive to a signal form said lower-order counter, said lower-order counter transmitting said signal upon said lower-order address bit being transferred to a predetermined one of said lower-order address locations;

a plurality of registers each for addressing a respective memory location, a first input of each said register receiving an output from a higher-order address location, a second input of each said register receiving an output from a lower-order address location, each of said registers operable to address said respective memory location responsive to sensing said lower-order address bit and said higher-order address bit at its inputs.

17. The FIFO memory of claim 1 wherein said write pointer and said read pointer each include:

a plurality of counters each of a different order and including at least a low-order counter and a high-order counter, each counter provided for storing an address digit of particular order, said address digits in combination representing one of a plurality of memory locations in said memory;

each counter having a plurality of stages, each corresponding to an address digit value, an address bit stored in one of said plurality of stages for indicating the value of the respective address digit;

said counters coupled in cascading fashion in ascending order with said high-order counter coupled to said low-order counter, a high-order address bit of said high-order counter incremented from a current stage to a next stage responsive to a signal from said low-order counter, said low-order counter operable to transmit said signal responsive to a low-order address bit thereof being incremented to a predetermined one of said lower-order stages; and a plurality of registers each for addressing a respective memory location, each register having a plurality of inputs each coupled to an output of a stage in each counter;

each stage in each said counters operable to transmit an address bit signal responsive to having an address bit stored therein, each said register operable to address a respective memory location responsive to receiving address bit signals on all its inputs.

18. The read and write pointers further of claim 16 further including a clock signal source operable to transmit clock pulses, each clock pulse having first and second transitions;

said respective lower-order counter and said respective higher-order counter coupled to said clock signal source, said lower-order counter operable to increment from a first address location to a next address location responsive to said first transition of a clock pulse;

each respective said register including a latch coupled to said lower-order counter and said higher-order counter, said latch operable to store an address signal responsive to said second transition of a prior clock pulse;

said address signal transmitted from said latch to a respective address location in said memory responsive to said first transition.

19. The FIFO memory of claim 1 wherein each said read pointer and said write pointer include:

a respective lower-order ring counter having a plurality of lower-order stages each operable to store a lower-order address bit, said lower-order stages each having an output and an input, the outputs of each said lower-order stage coupled to the input of a next lower-order stage in an endless ring, each lower-order stage having a clock input;

a respective higher-order ring counter having a plurality of higher-order stages each operable to store a higher-order address bit, said higher-order stages each having an output and an input, the output of each said higher-order stage coupled to the input of a next higher-order stage in an endless ring, each higher-order stage having a clock input;

a respective last lower-order stage having an output coupled to said clock inputs of said higher-order stages, the receipt by said last lower-order stage of said lower-order address bit actuating the transmission of a higher-order clock signal to said higher-order clock inputs, said higher-order address bit incrementing from a current higher-order stage to a next higher-order stage responsive thereto;

a respective plurality of product gates, each product gate receiving as inputs an output from a selected one of said higher-order stages and an output from a selected one of said lower-order stages, each product gate having a combination of inputs different from the combination of inputs of each other gate; and a respective plurality of registers each selectively coupled to an output of a respective product gate for addressing a respective memory location responsive to said respective product gate sensing said lower-order and said higher-order address bits.

20. The FIFO memory of claim 19 wherein said product gates further include a plurality of last product gates having an input coupled to said last lower-order stage, said product gates further including a plurality of first product gates each having an input connected to a first lower-order stage, said last lower-order stage operable to increment said lower-order address bit to said first lower-order stage responsive to a clock signal;

an output of each last product gate coupled to an inverter, said last product gates arranged in an array wherein successive ones of said higher-order stage outputs are coupled to successive ones of said last product gates, an output of each last product gate inverter coupled to an input of a successive last product gate input, said output of said last product gate inverter further coupled to an input of a first product gate coupled to the same higher-order stage output;

each responsive inverter preventing the addressing by a respective first product gate or a respective next successive last product gate of memory locations corresponding thereto.

21. The FIFO memory of claim 19 wherein each product gate has a read power-up output coupled to a respective address memory location for enabling a read operation of said memory location.

22. The FIFO memory of claim 19 wherein each product gate has a write select output and a write power-up output;

each respective register having a latch for storing a write select signal, a sum gate coupled to an output of said latch for generating a write enable signal on a first sum gate output, said sum gate further connected to a clock signal source;

said sum gate having a second output connected to a write power-up gate, said write power-up gate receiving as an input a respective write power-up output from a respective product gate and outputting a write power-up signal responsive to an active stage of either said write power-up signal from said product gate line or said second output from said sum gate.

23. The FIFO memory of claim 1 further including:

a write/read controller for generating a write pulse responsive to an external write command and for generating a read pulse responsive to an external read command, said write pointer addressing a write memory location of a plurality of memory locations responsive to said write pulse, said read pointer addressing a read memory location of said plurality of memory locations responsive to said read pulse, said write/read controller comprising:

a write pulse generator for generating said write pulse responsible to said external write command;

a read pulse generator for generating said read pulse responsible to said external read command;

a register coupled to said write and read pulse generators for determining whether a write pulse or a read pulse was last generated;

a pointer equality input for indicating that said write memory location is equal to said read memory location; and a disabler for disabling said write pulse generator and said read pulse generator, said disabler coupled to said pointer equality input and said register, said disabler disabling said write pulse generator responsive to an active state of said equality input and the last generated pulse being a write pulse, said disabler disabling said read pulse generator responsive to an active state of said equality input and the last generated pulse being a read pulse.

24. The FIFO memory of claim 23 further including:

a data bit storage circuit for storing a binary data bit therein;

at least one data input coupled to said data storage circuit for writing a data bit therein;

a write enable line coupled to said storage circuit for initiating the writing of a data bit into said storage circuit;

a write power-up line coupled to said storage circuit for enabling the writing of a data bit into said storage circuit, said write power-up line activating only a predetermined number of cells out of a plurality of cells in said memory;

a read circuit having an input coupled to said storage circuit, a read enable line coupled to said read circuit for addressing said memory cell for initiating the reading of a data bit from said storage circuit; and a read power-up line coupled to said read circuit for enabling the data bit storage in said cell to be read out on said data output, said read power-up line enabling only selected ones of said plurality of memory cells in said memory.

* * * * *